United States Patent [19]
Furuyama

[11] Patent Number: 5,359,566
[45] Date of Patent: Oct. 25, 1994

[54] DYNAMIC RANDOM ACCESS MEMORY

[75] Inventor: Tohru Furuyama, tokyo, Japan

[73] Assignee: Kabushiki Kaisha Toshiba, Kawasaki, Japan

[21] Appl. No.: 890,252

[22] Filed: May 29, 1992

[30] Foreign Application Priority Data

May 29, 1991 [JP] Japan .................. 3-125998

[51] Int. Cl.$^5$ ............................................. G11C 11/24
[52] U.S. Cl. ....................... 365/149; 365/189.01; 365/189.12
[58] Field of Search ........... 365/149, 203, 222, 189.01, 365/189.12, 230.06, 233, 194

[56] References Cited

U.S. PATENT DOCUMENTS

| | | | |
|---|---|---|---|
| 3,763,480 | 10/1973 | Weimer | 340/173 R |
| 4,070,590 | 1/1978 | Ieda et al. | 365/203 |
| 4,225,945 | 9/1980 | Kuo | 365/149 |
| 4,593,382 | 6/1986 | Fujishima et al. | 365/149 |
| 4,648,073 | 3/1987 | Kenney | 365/149 |
| 4,669,063 | 5/1987 | Kirsch | 365/189 |
| 4,758,987 | 7/1988 | Sakui | 365/189 |
| 4,943,944 | 7/1990 | Sakui et al | 365/189.05 |
| 4,980,863 | 12/1990 | Ogihara | 365/205 |
| 5,025,294 | 6/1991 | Ema | 357/23.6 |
| 5,051,954 | 9/1991 | Toda et al. | 365/149 |
| 5,079,746 | 1/1992 | Sato | 365/225.7 |
| 5,091,761 | 1/1992 | Hiraiwa et al. | 357/23.6 |
| 5,091,885 | 2/1992 | Ohsawa | 365/203 |
| 5,172,198 | 12/1992 | Aritome et al. | 257/315 |
| 5,184,326 | 2/1993 | Hoffman et al. | 365/201 |

FOREIGN PATENT DOCUMENTS

0157051 10/1985 European Pat. Off. .
0273639 7/1988 European Pat. Off. .
0398244 11/1990 European Pat. Off. .
1922761 2/1970 Fed. Rep. of Germany .

OTHER PUBLICATIONS

K. Kimura, et al., "A Block–Oriented RAM with Half–Sized DRAM Cell and Quasi–Folded Data–Line Architecture", ISSCC 91, pp. 106–107, Feb. 1991.

M. Asakura, et al., "Cell–Plate Line Connecting Complementary Bitline (C$^3$) Architecture for Battery Operating DRAMS", 1991 Sym. on VLSICKTS, pp. 59–60, May 30, 1991.

Arimoto et al., "A Circuit Design of Intelligent CDRAM with Automatic Write back Capability", 1990 Symposium on VLSI Circuits, Digest of Technical Papers, pp. 79–80.

Shah et al., "A 4Mb DRAM with Cross-point Trench Transistor Cell", 1986 ISSCC Digest of Technical Papers, pp. 268–269.

Ema et al., "3–Dimensional Stacked Capacitor Cell for 16M and 64M DRAMS", 1988 IEDM Technical Digest, pp. 592–595.

(List continued on next page.)

Primary Examiner—Eugene R. LaRoche
Assistant Examiner—F. Niranjan
Attorney, Agent, or Firm—Banner, Birch, McKie & Beckett

[57] ABSTRACT

A semiconductor memory device according this invention comprises a memory cell array in which cascade memory cells arranged in matrix form, each cell being composed of a plurality of MOS transistors cascade-connected to each other, and a plurality of information storing capacitors one end of each of which is connected to one end of each of the transistors, respectively, word lines equally connected to the memory cells in each row of the memory cell array, a bit line equally connected to each column of the memory cell array, a capacitor-plate line provided for each column of the memory cell array, and equally connected to the other end of each of the capacitor groups in the memory cells in the corresponding column, a bit-line precharger circuit connected to each of the bit lines, a capacitor-plate line precharger circuit connected to each of the capacitor-plate lines, and a sense amplifier circuit which is provided for column of the memory cell array, and which senses the potential between the bit line and the capacitor-plate line in the read operation.

45 Claims, 16 Drawing Sheets

OTHER PUBLICATIONS

Watanabe et al., "Stacked Capacitor Cells for High-density Dynamic RAMs", 1988 IEDM Technical Digest, pp. 600–603.

Sunouchi et al., "A Surrounding Gate Transistor (SGT) Cell for 64/256 MBit DRAMs", 1989 IEDM Technical Digest, pp. 23–26.

Fujishima et al., "A storage-Node-Boosted RAM with Word-Line Delay Compensation", IEEE Journal of Solid State Circuits, vol. SC-17, No. 5, pp. 872–875, Oct. 1982.

Ohta et al., "A Novel Memory cell Architecture for High-Density DRAMs", 1989 Symposium of VLSI Circuits, Digest of Tech. Papers, pp. 101–102.

Ohta et al., "Quadruply Self-Aligned Stacked High-Capacitance RAM Using $Ta_2O_5$ High Density VLSI Dynamic Memory", IEEE Transactions on Electron Devices, vol. ED-29, No. 3, Mar. 1982, pp. 368–376.

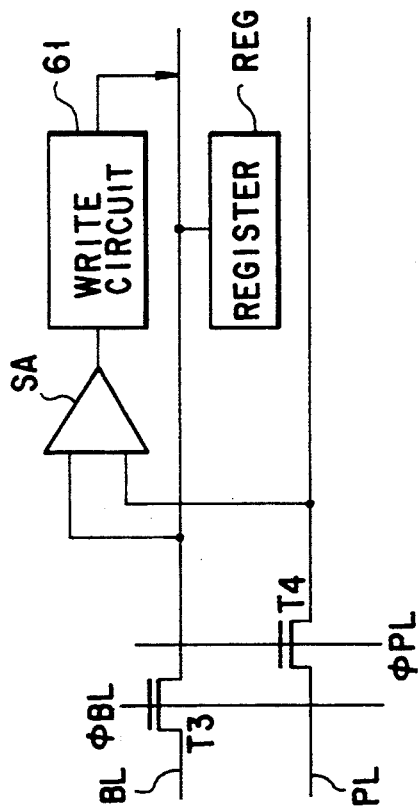
F I G. 6
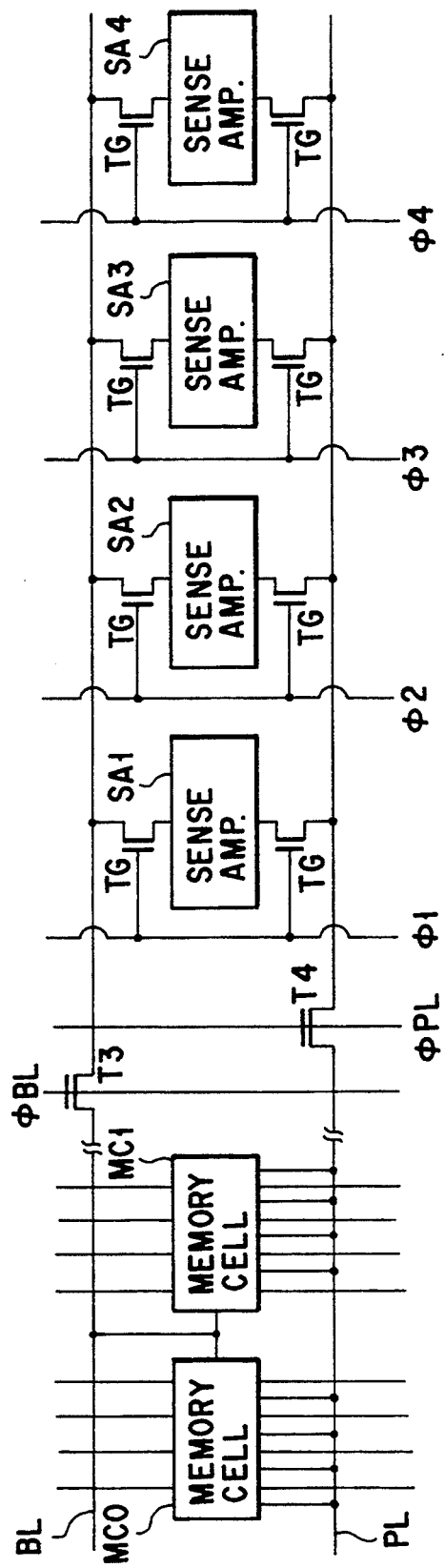
F I G. 7

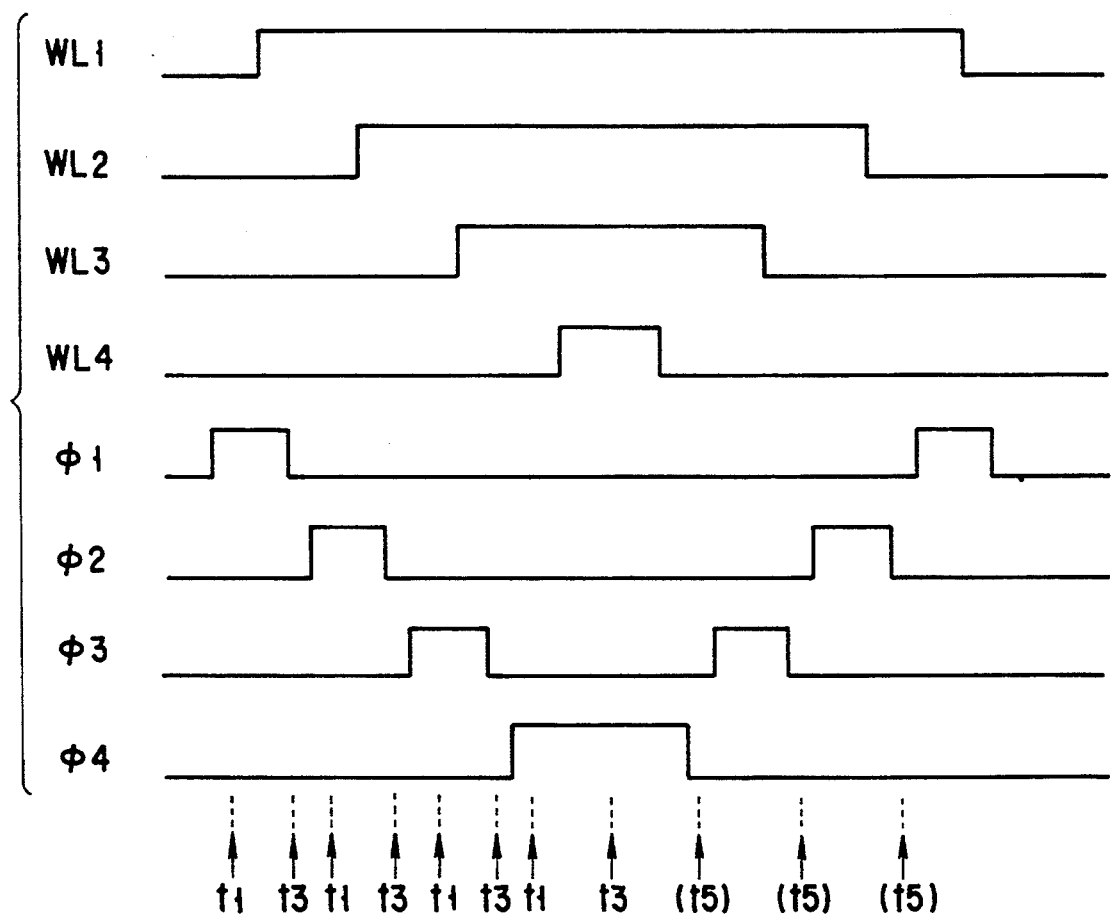
F I G. 8

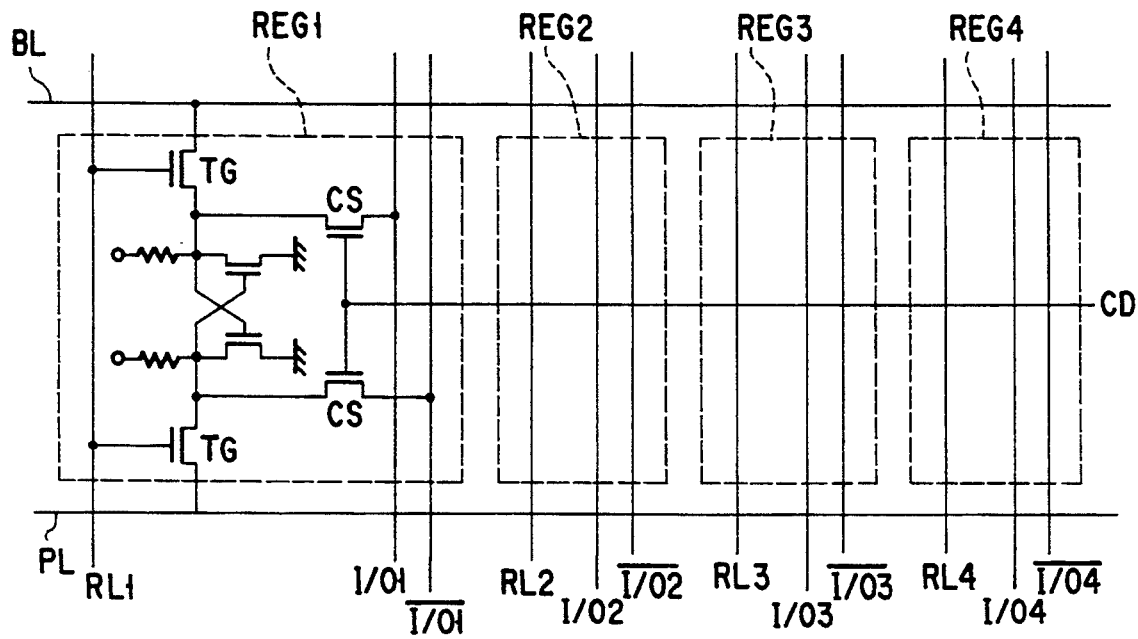
F I G. 9
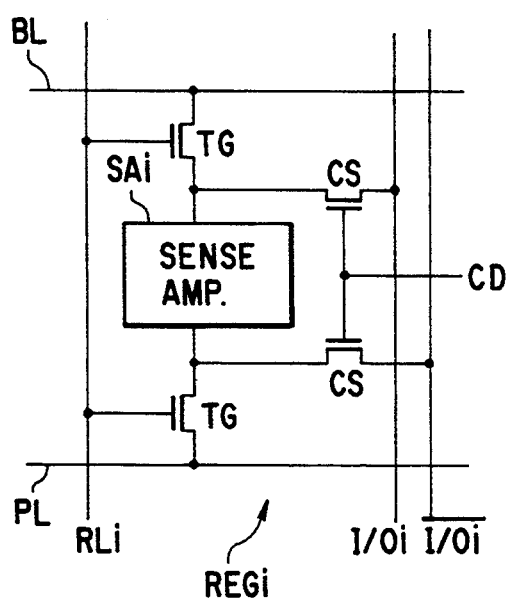
F I G. 10

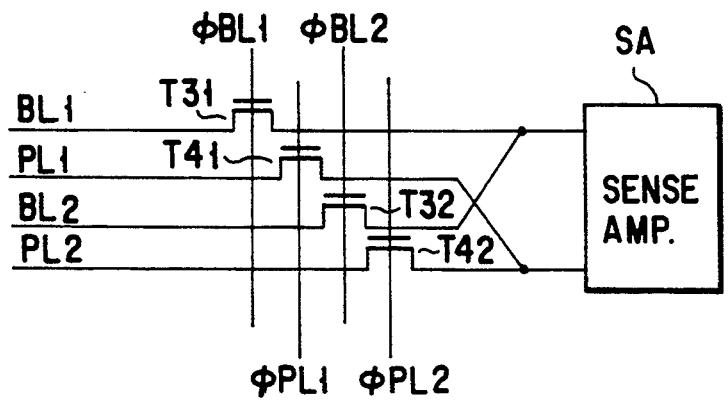
F I G. 11
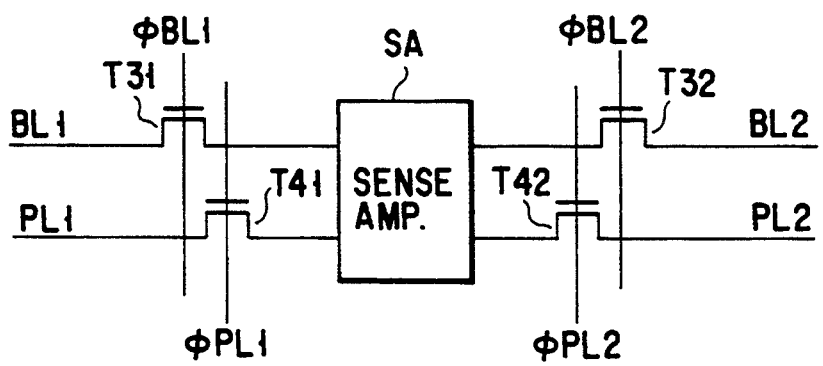
F I G. 12
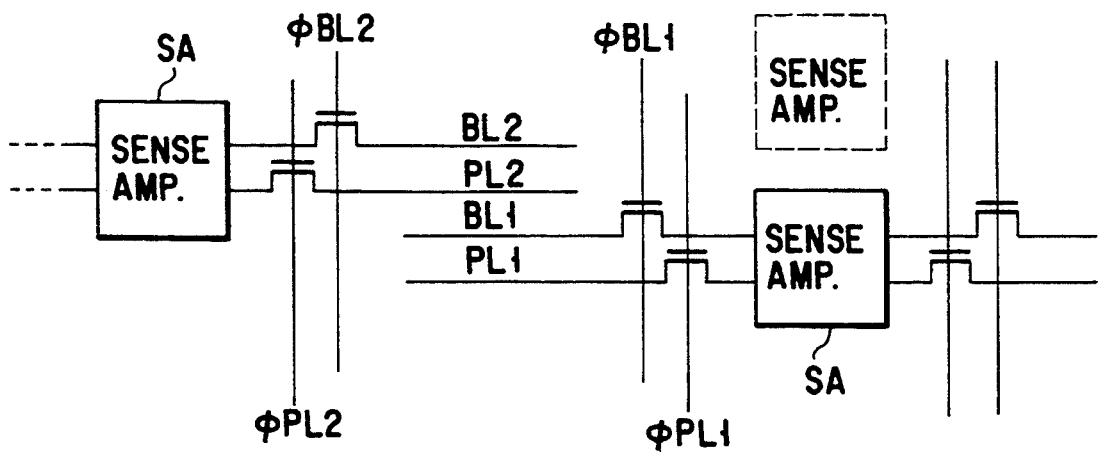
F I G. 13

DYNAMIC RANDOM ACCESS MEMORY

BACKGROUND OF THE INVENTION

1. Field of the Invention

This invention relates to a semiconductor memory device, and more particularly to a dynamic random access memory containing a cascade dynamic memory cell array capable of storing bits of information on a bit basis.

2. Description of the Related Art

DRAM cells now in practical use are composed of a transfer gate MOS (insulated-gate type) transistor connected to a word line and a bit line, and an information storing capacitor connected to this transistor.

The inventor of this application has proposed a cascade gate semiconductor memory cell with a view to squeezing more DRAM cells in a single chip at lower per-bit cost, as disclosed in U.S. patent application Ser. No. 687,687.

The cascade gate memory cell is capable of storing bits of information on a bit basis. An array of memory cells of this type requires the memory cells to connect to the bit lines at a rate of one connection for every plurality of bits. This allows much higher packing density than a DRAM using a conventional single-transistor, single-capacitor cell array, thereby reducing the per-bit cost remarkably.

The inventor has also proposed a semiconductor memory device that comprises the above cascade gate memory cell array and a storing means for temporarily storing bits of information read time-sequentially from a memory cell, and that can rewrite (or write) the bits of information after the reading is complete, as disclosed in U.S. patent application Ser. No. 721,255.

In the above cascade memory cell, although the smaller per-bit capacitor size tends to lower its capacitance Cs, only connection of memory cells with bit lines for every plurality of bits reduces the bit-line capacitance Cb. With an increasing capacity of cell arrays, however, an attempt to increase the number of bits per bit line will make the value Cb/Cs larger, introducing the risk of the sense margin of the bit-line sense amplifier being reduced in the read operation.

SUMMARY OF THE INVENTION

Accordingly, the object of the present invention is to provide a semiconductor memory device capable of increasing the sense margin by increasing the amount, of input signal to the bit-line sense amplifier in the read operation of the cascade memory cell array.

The foregoing object is accomplished by providing a semiconductor memory device comprising: a memory cell array in which cascade memory cells arranged in matrix form, each cell being composed of a plurality of MOS transistors cascade-connected to each other, and a plurality of information storing capacitors one end of each of which is connected to one end of each of the transistors, respectively; word lines equally connected to the memory cells in each row of the memory cell array; a bit line equally connected to each column of the memory cell array; a capacitor-plate line provided for each column of the memory cell array, and equally connected to the other end of each of the capacitor groups in the memory cells in the corresponding column; a bit-line precharger circuit connected to each of the bit lines; a capacitor-plate line precharger circuit connected to each of the capacitor-plate lines; and a sense amplifier circuit which is provided for column of the memory cell array, and which senses the potential between the bit line and the capacitor-plate line in the read operation.

With such an arrangement, when data is read from a memory cell in the cascade memory cell array, the bit-line potential changes with the charge at one end of the cell capacitor distributed over the bit-line capacitance, while the capacitor-plate line potential changes in the opposite direction of that of a change in the bit-line potential, with the charge at the other end of the cell capacitor distributed over the capacitor-plate line capacitance. Such potential changes between the bit line and capacitor-plate line are sensed by the sense amplifier circuit. Consequently, the amount of input signal to the sense amplifier is twice as large as that with the capacitor-plate line potential fixed, which increases the sensing margin.

Therefore, even if an attempt to increase the number of bits per bit line to keep up with an increasing capacity of cell arrays leads to an increase the value Cb/Cs and capacitor-plate line capacitance, it is possible to provide a highly reliable semiconductor memory device that allows the bit-line sense amplifier to operate properly.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is a block diagram of another example of the sense amplifier in FIG. 1 or Fig.

FIG. 7 is a circuit diagram of a portion of a DRAM memory cell array according to a third embodiment of the present invention;

FIG. 8 is a waveform diagram showing the timing of various signals for the purpose of explaining the operation of one column in the DRAM of Fig.

FIG. 9 is a circuit diagram of a portion of a DRAM memory cell array according to a fourth embodiment of the present invention;

FIG. 10 is a circuit diagram showing a modification of each element of the register in the DRAM of Fig.

FIG. 11 is a circuit diagram of a portion of a DRAM memory cell array according to a fifth embodiment of the present invention FIG. 12 is a circuit diagram of a portion of a DRAM memory cell array according to a sixth embodiment of the present invention;

FIG. 13 is a circuit diagram of a portion of a DRAM memory cell array according to a seventh embodiment of the present invention;

DETAILED DESCRIPTION OF THE PREFERRED EMBODIMENTS

Figure 1:
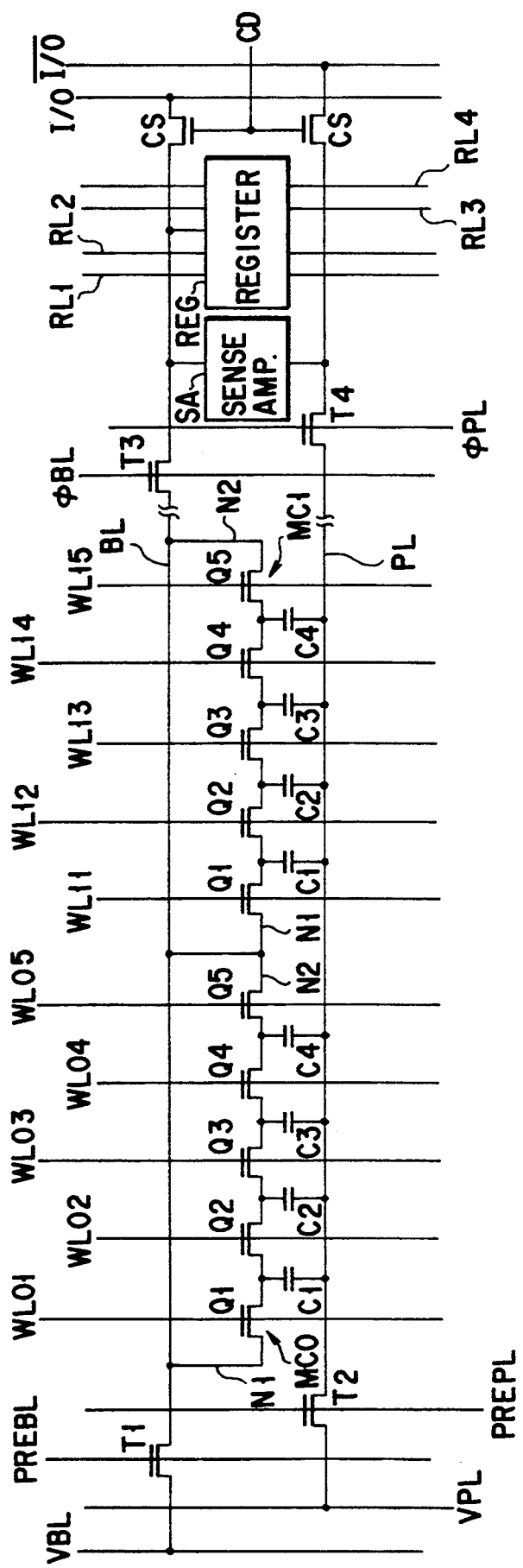
FIG. 1 is a circuit diagram of a portion of a DRAM memory cell array according to a first embodiment of the present invention.

Referring to the accompanying drawings, embodiments of the present invention will be explained. Like parts are indicated by corresponding reference characters throughout the drawings with the aim of avoiding repetitive explanations.

FIG. 1 is a circuit diagram of a column of a DRAM memory cell array according to a first embodiment of the present invention.

The DRAM contains a memory array of an open bit-line structure or a single-end sense amplifier structure. The memory cell array, in which cascade gate memory cells MCi (i=0, 1, . . .) are arranged in matrix form, has a pattern layout where memory capacitors are located near the respective intersections of bit lines and word lines. For the sake of clarity, only two memory cells MC0 and MC1 are shown here. Reference character BL indicates a bit line connected to memory cells MC0 and MC1 in the same column of the memory cell array. Reference characters WL01 to WL05, and WL11 to WL15 denote word lines connected to all memory cells MCi in the same row, those word lines being driven by word-line drivers (not shown).

The memory cell MCi is composed of a cascade gate consisting of three or more (five, here) MOS transistors Q1 to Q5 cascade-connected between a first node N1 and a second node N2, and information storing capacitors C1 to C4 each connected, at one end, to the respective connection nodes between the cascade-connected MOS transistors. The first and second nodes N1 and N2 are both connected to bit line BL.

The other end (plate electrode) of each of capacitors C1 to C4 is equally connected to a capacitor plate line PL. The capacitor plate line PL is formed separately for each column, so as to be the wiring on a layer below the corresponding bit line.

Reference character T1 indicates a bit-line precharging MOS transistor, PREBL a bit-line precharging signal for on/off control of transistor T1, and VBL a bit-line precharging potential.

Reference character T2 represents a capacitor-plate line precharging MOS transistor, PREPL a capacitor-plate line precharging signal for on/off control of transistor T2, and VPL a capacitor-plate line precharging potential.

Reference character SA is a sense amplifier that senses the potential between bit line BL and capacitor plate line PL. In this example, a latch amplifier (for example, a CMOS flip-flop circuit) is used which is connected to bit line BL and capacitor plate line PL at its pair of input/output nodes.

Reference character T3 indicates a first transfer gate (MOS transistor) inserted between the bit line and one input node of the sense amplifier SA, and BL a control signal for on/off control of the transfer gate T3.

Reference character T4 indicates a second transfer gate (MOS transistor) inserted between the capacitor plate line and the other input node of the sense amplifier SA, and ¢PL a control signal for on/off control of the transfer gate T4.

Reference character REG denotes a storage circuit for temporarily storing bits of information read time-sequentially from the selected memory cell. For this storage circuit, a register circuit is used which has as many storing elements as the number of the capacitors (the number of bits) of the memory cell MCi (refer to REG1 to REG4 in FIG. 9). These elements REG1 to REG4 are controlled by control signal lines RL1 to RL4, respectively.

Reference character CS indicates a column select switch controlled by the output CD of a column decoder (not shown), and I/O and/(I/O) complementary input/output lines.

Figure 2:
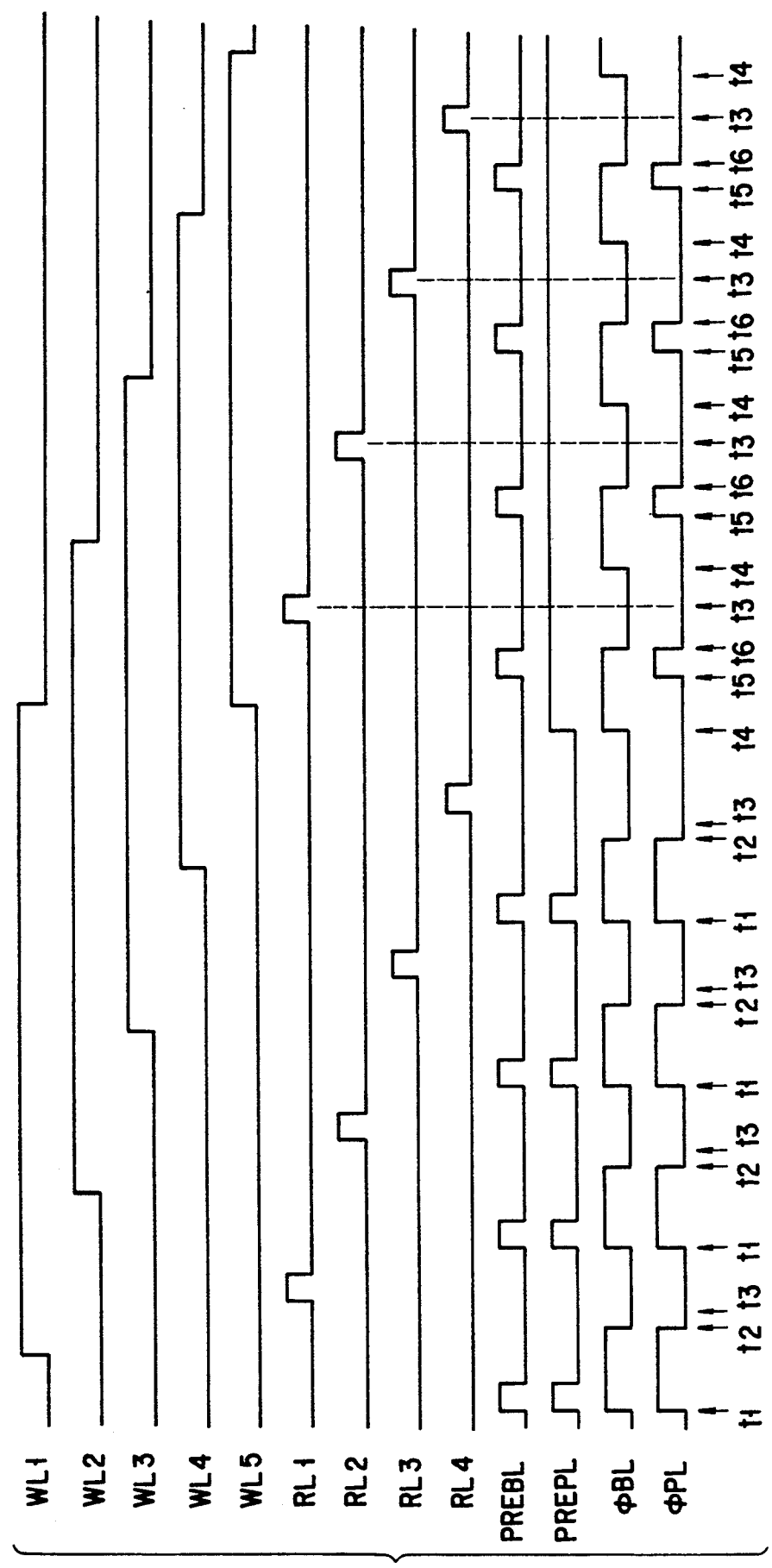
FIG. 2 is a waveform diagram showing the timing of various signals for the purpose of explaining the operation of one column in the DRAM of FIG. 1.

FIG. 2 is a waveform diagram showing the timing of various signals for the purpose of explaining the operation of one column in the FIG. 1 DRAM.

Reference characters WL1 to WL5 are word lines connected to a single memory cell MCi.

t1 is the timing of precharging the bit line BL and capacitor-plate line PL in the read operation.

t2 is the timing of turning off the first and second transfer gates T3 and T4 in the read operation.

t3 is the timing of operating the sense amplifier SA, t4 the timing of turning on the first transfer gate T3 in the write operation, and t5 the timing of precharging the bit line BL and turning on the second transfer gate T4 in the write operation.

t6 is the timing of ceasing to precharge the bit line BL and turning off both first and second transfer gates T3 and T4.

The precharging transistors T1 and T2 are turned on and off independently, and in this example, are turned on and off at the same timing during the reading of information from the memory cell.

The precharging transistor T2, in this example, is placed in the on state in writing into the memory cell, to fix the capacitor-plate line PL to the capacitorplate line precharging potential VPL.

In this example, the precharging transistors T3 and T4 are turned on and off independently. They are turned on and off at the same timing in reading from the memory cell, whereas being turned on at a different timing in writing (rewriting) into the memory cell.

A general explanation of the read/write operation in the column will be given. It is assumed that word lines WL1 to WL5 are turned on and off with the timing shown in FIG. 2 to turn on and off transistors Q1 to Q5 in that order. Control signal lines RL1 to RL4 are assumed to be turned on and off with the timing of FIG. 2 to operate the elements of the register REG in the order of REG1 to REG 4 at the start of storing and after the storing is complete.

Such control enables the information stored in each of capacitors C1 to C4 of the memory cell MCi to be read onto bit line BL in sequence, and to be stored in the elements REG1 to REG4 of the register REG, and then the information on the bit line BL to be sequentially written in the respective capacitors C1 to C4.

Therefore, the stored information in each of capacitors C1 to C4 of the memory cell MCi can be read outside from the DRAM chip at time t3 when the corresponding word lines WL1 to WL4 are on and the sense amplifier SA starts operating. That is, four bits of digital information are ready to be read in a predetermined order.

The read/store operation in the column will be explained in detail.

At time t1, the bit line BL and capacitor plate PL are precharged by the precharge transistors T1 and T2 to the potentials VBL and VPL, respectively, (normally, VBL=VPL). After the precharging has been completed, when word line WL1 turns on, transistor Q1 of the memory cell turns on, allowing the stored information in capacitor C1 to be read onto bit line BL via transistor Q1. At the same time, the charge at the other end of capacitor C1 is distributed over the capacitance of the capacitor plate line.

Then, at time t2, the transfer gates T3 and T4 turn off. At time t3, the sense amplifier SA operates to sense and amplify the potential between the bit line and capacitor plate line. After this, the control signal line RL1 turns on to store the information in capacitor C1 amplified by the sense amplifier SA in the first element REG1 of the register REG. Then, control signal line RL1 turns off.

Next, after the bit line BL and capacitor plate line PL have been precharged again at time t1, with word line WL1 on, word line WL2 turns on. This turns on the transistor Q2 of the memory cell, permitting the stored information in capacitor C2 to be read onto bit line BL via transistors Q2 and Q1, and at the same time, the charge of the other end of capacitor C2 is distributed over the capacitance of the capacitor plate line PL.

Then, at time t2, transfer gates T3 and T4 turn off. At time t3, the sense amplifier SA operates to sense and amplify the potential between the bit line and capacitor plate line. After this, the control signal line RL2 turns on to store the information in capacitor C2 amplified by the sense amplifier SA in the second element REG2 of the register REG. Then control signal line RL2 turns off.

From this time on, similar operations are repeated until the stored information in capacitors C3 and C4 is stored in the third and fourth elements REG3 and REG4 of the register REG, respectively.

Then, with the second transfer gate T4 off, capacitor plate line PL is precharged at time t4, and at the same time, the first transfer gate T3 turns on. After this, word line WL5 turns on and word line WL1 turns off (these actions may take place in reverse order or at the same time).

Next, after bit line BL has been precharged at time t5, and at the same time, the second transfer gate T4 has turned on to precharge the two input nodes of the sense amplifier SA, the precharging of bit line BL ceases at time t6, and at the same time, transfer gates T3 and T4 turn off.

Then, with the capacitor-plate line PL precharged (that is, fixed to the capacitor-plate line precharging potential VPL), the control signal line RL1 turns on, which gates on the first element REG1 of the register REG, allowing the sense amplifier SA to operate at time t3.

Then, at time t4, the first transfer gate T3 turns on, which sets the rewrite potential on bit line BL according to the data temporarily stored in the first element REG1.

In this state, when word line WL2 turns off, transistor Q2 turns off, permitting the rewriting of information into capacitor C1.

Next, after bit line BL has been precharged at time t5, and at the same time, the second transfer gate T4 has turned on to precharge the two input nodes of the sense amplifier SA, the precharging of bit line BL ceases at time t6, and at the same time, transfer gates T3 and T4 turn off.

Then, control signal line RL2 turns on, which gates on the second element of the register REG, causing the sense amplifier SA to operate at time t3.

At time t4, the first transfer gate T3 turns on, which sets the rewrite potential on bit line BL according to the data temporarily stored in the second element REG2.

In this state, when word line WL3 turns off, transistor Q3 turns off, permitting the rewriting of information into capacitor C2.

From this time on, by similar operations, the information is rewritten into capacitors C3 and C4 in sequence.

In the operation of the FIG. 1 DRAM, the input amount of signal to the sense amplifier SA increases in the read operation, making the margin of sense operation larger. The reason for this will be explained below.

The capacitance, the amount of charge, and the across-the-end voltage of each of capacitors C1 to C4 are indicated by Cs, Qs, and Vs, respectively. The capacitance of bit line BL (including the capacitance of the input nodes of sense amplifier SA) is indicated by Cb, the capacitance of capacitor-plate line PL (including the capacitance of the input nodes of sense amplifier SA) by Cp, and the series capacitance of the capacitor capacitance Cs and the capacitor-plate capacitance Cp, $Cs \cdot Cp/(Cs+Cp)$ by Csp.

When the corresponding word lines WL1 to WL4 turn on during the reading of the stored information from each of capacitors C1 to C4, a variation in the potential on bit line BL, $\Delta VBL$ will be:

$$\Delta VBL = \{(Cb \cdot VBL + Csp \cdot Vs)/(Cb + Csp)\} - VBL \quad (1)$$
$$= (Vs - VBL)/\{(Cb/Csp) + 1\}$$
$$= (Vs - VBL)/[\{Cb \cdot (Cs + Cp)/Cs \cdot Cp\} + 1]$$

Based on the principle of the conservation of charge, a variation in the potential on capacitor-plate line PL, $\Delta VBL$ will be:

$$Bc \cdot \Delta VBL + Cp \cdot \Delta VPL = 0$$

and $$\Delta VPL = -Cb \cdot \Delta VBL/Cp \quad (2)$$

Thus, for the setting of VBL=VPL, for example, the input amount of signal to the sense amplifier SA, VSA will be:

$$VSA = \Delta VBL - \Delta VPL \quad (3)$$
$$= \{1 + (Cb/Cp)\}\Delta VBL$$
$$= (Vs - VBL)/[1 + (Cb/Cs)\{Cp/(Cb + Cp)\}]$$

Conventionally, the capacitor-plate line potential was fixed to Vcc/2, and the input amount of signal to the sense amplifier SA, $VSA_{conv}$ was:

$$VSA_{conv} = \Delta VBL_{conv} \quad (4)$$
$$= (Vs - VBL)/\{1 + (Cb/Cs)\}$$

To evaluate the degree of improvement in the input amount of signal to the sense amplifier SA, the ratio of equations (3) to (4) is expressed as:

$$VSA/VSA_{conv} = \{1+(Bc/Cs)\}/[1+(Cb/Cs)\{(Cp/(Cb+Cp)\}] \quad (5)$$

Because one end of each of capacitors C1 to C4 is in the floating state when the transistors Q1 to Q4 of the memory cell are in the off state, the capacitance of the capacitor-plate line, Cp, is on the same order as or smaller than the capacitance of the bit line, Cb.

Thus, the expression $Cb \geq Cp$ holds, and the degree of improvement in the sense amplifier signal input amount will be:

$$VSA/VSA_{conv} \geq \{1+(Cb/Cs)\}/\{1+(Cb/Cs)/2\} \quad (6)$$

Normally, Cb is sufficiently larger than Cs, the right side of the expression has nearly a value of 2.

That is, the signal input amount $V_{SA}$ for the sense amplifier SA in the present invention is nearly twice as large as that with the fixed capacitor-plate potential.

At time t3 when the sense amplifier SA operates after having received the capacitor information, transfer gates T3 and T4 are turned off, which separates bit line BL and capacitor-plate line PL from sense amplifier SA, enabling a high speed operation of sense amplifier SA. The sense amplifier SA charges and discharges bit line BL only when rewriting (or writing) data into the capacitor, which helps to lower power consumption.

In the DRAM of FIG. 1, transistors Q5 to Q1 of the memory cell MCi are turned on in that order, and turned off in the same order, and the elements of the register REG are operated in the order of REG4 to REG 1. This makes it possible to read the stored information from capacitors C4 to C1 onto bit line BL, starting at capacitor C4 near the second node N2, and at the same time, to store them in the register REG, and then to write the information on bit line BL in each of capacitors C4 to C1, starting at capacitor C4 downward.

For the write operation in the FIG. 1 DRAM, the data write circuit (not shown) only places Vcc or 0 V on bit line BL according to the data to be written into with the timing of rewriting as mentioned earlier. Each column and the data input/output circuit (not shown) are selectively connected to each other by input/output lines I/O and/(I/O), enabling the writing of the input data or the transfer of the read-out data to the output section. The input/output lines I/O and/(I/O) may be used for both input and output or be separated into input lines and output lines.

Each element of the register REG, having stored the data, may be turned off after bit line BL has been precharged. In a case where the correct data has to be stored in the register REG even after the writing of information into the memory cell has finished, such as a case where the register is used as a cache memory, which will be explained later, it is desirable that each element of the register REG should be gated off with the timing of control signal lines RL1 to RL4 as shown in FIG. 2.

More specifically, the timing with which each element of the register REG operates at the beginning of storing data may be much earlier as long as the information read from the capacitors can be stored correctly.

A potential equalizer circuit (not shown) may be connected between the bit line and capacitor-plate line so as to undergo on/off control by bit-line precharging signal PREBL.

A precharger circuit or a potential equalizer circuit may be connected to the bit line and capacitor-plate line on side of sense amplifier SA beyond transfer gates T3 and T4 (the signal input nodes of sense amplifier SA) so that these circuits may undergo on/off control by the bit-line precharging signal PRERL. In this case, the precharging of the bit line by the bit-line precharging transistor T1 may be eliminated.

For the capacitance of each of capacitors C1 to C4 of the memory cell CMi in FIG. 1, increasing their value as pieces of the information are read in sequence, alleviates or prevents a gradual decrease in the voltage change on bit line BL in the sequential reading of the stored information from each capacitor. This has been proposed by the inventor of this application, et al. in Published Unexamined Japanese Patent Application No. 3-41321. This makes each voltage change almost equal, thereby avoiding a faulty reading of information.

The storing circuit REG may be constructed in various ways as disclosed in U.S. patent application Ser. No. 721,255.

The capacitor-plate line PL is not limited to the wiring in a layer below bit line BL, but may be formed as the wiring in a layer above bit line BL using the techniques as disclosed in "A New Stacked Capacitor DRAM Cell Characterized by a Storage Capacitor on a Bit-line Structure" by S. Kimura et al. IEDM 1988, pp. 596–998.

Serial access to the memory cells (serial reading and writing) in the FIG. 1 DRAM, puts some restrictions on the random access performance of the DRAM and the access time. Such restrictions, however, may be avoided by designing the DRAM so as to perform serial-parallel conversion of 4-bit memory-cell data in a read or a write with such a conversion, the DRAM of ×4-bit structure enables perfect random access.

When the memory cell array is divided into a plurality of subarrays and only some of the subarrays (for example, two or four subarrays) are activated simultaneously for power saving, serial-parallel conversion allows a DRAM of ×8-bit structure or ×16-bit structure.

In random access, which reads only the necessary data without serial-parallel conversion, it is not always necessary to read data from the first capacitor to the last one. The data may be read until the capacitor whose data is being accessed has been reached, and be supplied as the output.

Figure 3:
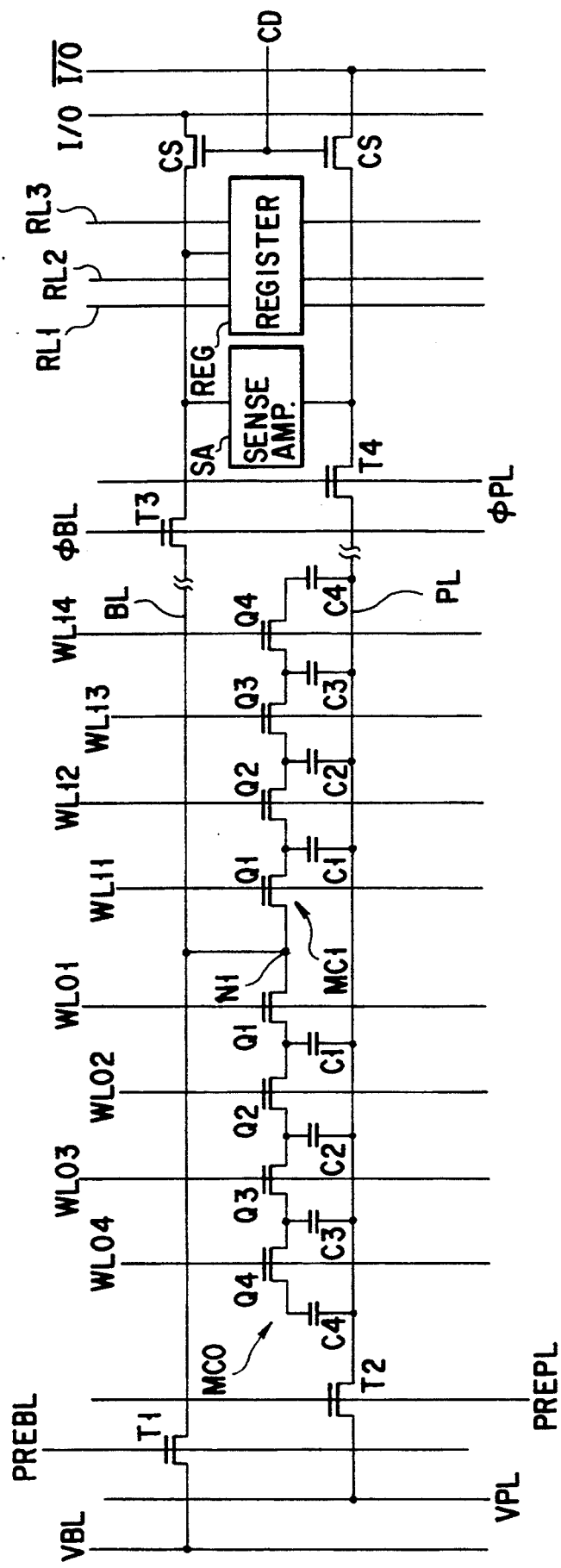
FIG. 3 is a circuit diagram of a portion of a DRAM memory cell array according to a second embodiment of the present invention.

FIG. 3 is a circuit diagram of a portion of a single column of a memory cell array in a DRAM according to a second embodiment of the present invention.

In the memory cell array, the cascade gate memory cell MCi (i=0, 1, . . .) is composed of a cascade gate consisting of a plurality of (four, in the case) MOS transistors Q1 to Q4 cascade-connected to each other, and a plurality of information storing capacitors C1 to C4, one end of each of which is connected to one end, farther from the node N1, of each of MOS transistors Q1 to Q4, respectively.

In the cascade gate whose one end (node N1) is connected to the bit line BL, the gates of transistors Q1 to Q4 of memory cell MC0 are connected to word lines WL01 to WL04, respectively, and the gates of transistors Q1 to Q4 of memory cell MC1 are connected to word lines WL11 to WL41, respectively.

A register circuit REG here contains as many storing elements (REG1 to REG3, not shown) as one less than the number of capacitors of the memory cell MCi (the number of bits). These elements REG1 to REG3 are controlled by control signal lines RL1 to RL3, respectively.

Figure 4:
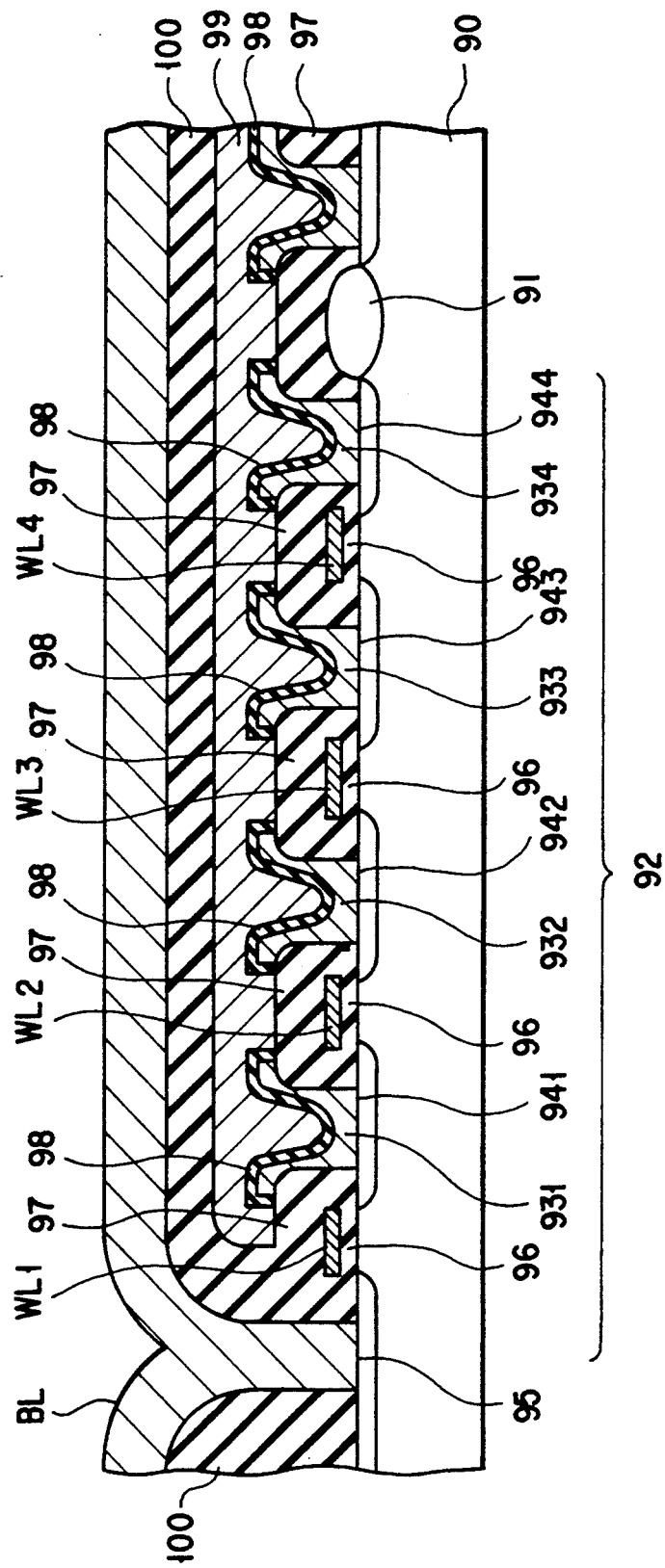
FIG. 4 is a sectional view of the DRAM cell of FIG. 1.

FIG. 4 is a sectional view showing the structure of an example of the FIG. 3 DRAM cell. What is shown here is an open bit-line type DRAM cell array of a stack cell structure where capacitors are located near the intersections of word lines and bit lines. This structure is also disclosed in U.S. patent application Ser. No. 687,687.

In FIG. 4, numeral 90 indicates a semiconductor substrate, 91 an element isolating region, 92 a cell active region in which the active regions (consisting of the source, drain, and channel regions) of four transistors Q1 to Q4 are arranged in a line at the surface of the semiconductor substrate, WL1 to WL4 the gates (word lines) of four transistors Q1 to Q4, respectively, 931 to 934 the storage nodes for four information storing capacitors C1 to C4, 941 to 944 contacts that connect the four storage nodes 931 to 934 to the source regions of the four transistors Q1 to Q4, respectively, 95 a contact (bit-line contact) that connects the drain region of transistor Q1 to bit line BL, 96 a gate insulating film, 97 an interlayer insulating film, 98 an insulating film for each of four capacitors C1 to C4, 99 a plate electrode for four capacitors C1 to C4, and 100 an interlayer insulating film.

Figure 5:
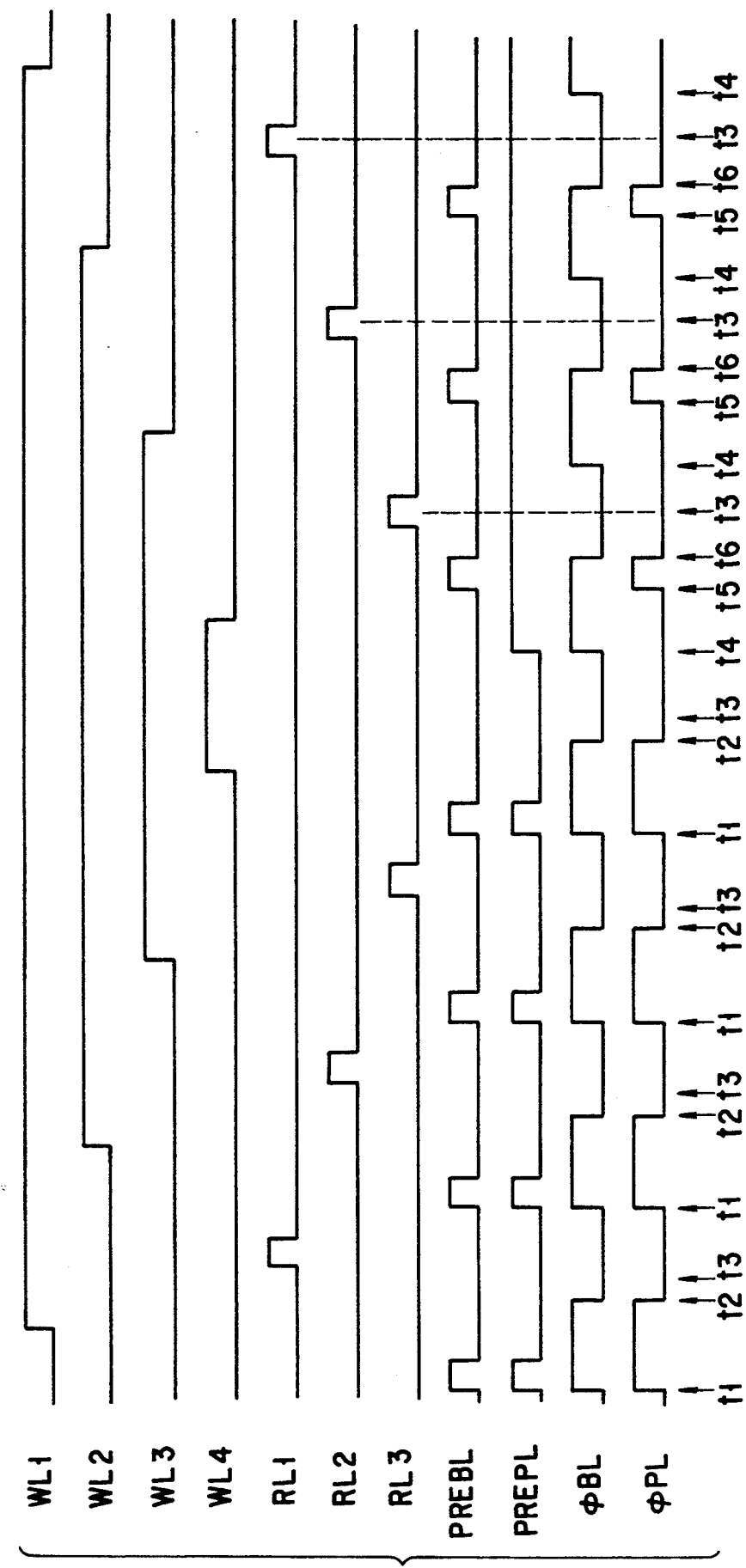
FIG. 5 is a waveform diagram showing the timing of various signals for the purpose of explaining the operation of one column in the DRAM of Fig.

FIG. 5 is a waveform diagram showing the timing of various signals for the purpose of explaining the operation of a column in the FIG. 3 DRAM.

WL1 to WL4 are word lines connected to a single memory cell MCi. In the figure, times t1 to t6 have the same meanings as in FIG. 5.

Since the operation of the FIG. 3 DRAM is similar to that of the FIG. 1 DRAM, which has been described referring to FIG. 2, explanation will be focused on what is different from the FIG. 1 DRAM's operation.

The transistors Q1 to Q4 of the memory cell are turned on in that order and off in reverse order. The elements of the register REG are operated in the order of REG1 to REG3 at the start of storing, and after the storing is complete, they are operated in the order of REG3 to REG1.

With such sequential operations, the stored information is read sequentially from capacitors C1 to C4 onto bit line BL, starting with capacitor C1 nearest to bit line BL, and at the same time, the stored information in capacitors C1 to C3 is stored in the first to third elements REG1 to REG 3 of the register REG. The information read from capacitor C4 and the information stored in the third to the first elements REG3 to REG1 are written sequentially into capacitors C4 to C1, starting with the capacitor C4 farthest from bit line BL.

The rewriting of data into capacitor C4 is done as follows. When word line WL4 turns on, transistor Q4 of the memory cell turns on, allowing the stored information in capacitor C4 to be read onto bit line BL. Then, at time t4, the capacitor-plate line PL is precharged, and a first transfer gate T3 turns on, which sets the rewrite potential on bit line BL according to the information read from capacitor C4. After this, word line WL4 turns off, which turns off transistor Q4, enabling the rewriting of information capacitor Q4.

In the DRAM of FIG. 3, a register with as many storing elements REG1 to REG4 as the number of capacitors in the memory cell MCi may be used to allow the information in four capacitors C1 to C4 of the memory cell to be temporarily stored in the four elements REG1 to REG4, respectively.

In the DRAMs in FIG. 1 and FIG. 3, a composite memory with a cache memory may be constructed by forming the register REG out of four SRAM cells, which are used as cache memories. The existence of the cache memory compensates remarkably for restrictions due to the serial accessibility of the memory cells MCi used in the above embodiments.

FIG. 6 shows another example of the sense amplifier SA in the DRAM in FIG. 1 or FIG. 3.

The sense amplifier SA is a differential amplifier whose pair of input nodes is connected to bit line BL and capacitor-plate line PL, respectively. Based on its sense output, the data write circuit 61 sets the rewrite potential on bit line BL. In use of such a differential sense amplifier SA, the transfer gates T3 and T4 may be turned on and off by a common control signal $\phi$BL. By placing transfer gates T3 and T4 in the off state during the writing (rewriting) of data into the memory cell, to separate bit line BL and capacitor-plate line PL from the differential sense amplifier SA, high-speed sensing is possible.

FIG. 7 is a circuit diagram of a portion of a column in a DRAM according to a third embodiment of the present invention.

The DRAM contains as many bit-line sense amplifiers SA1 to SA4 as the number of capacitors per memory cell, so that those amplifiers may also serve as storing circuits, in place of the register REG in the FIG. 3 DRAM. The four bit-line sense amplifiers SA1 to SA4 are connected to bit line BL and capacitor-plate line PL via corresponding transfer gate pairs TG and TG. The transfer gate pairs TG and TG are gated on and off by control signal lines $\phi1$ to $\phi4$.

FIG. 8 is a waveform diagram showing the timing of various signals with the aim of explaining the operation of a column in the DRAM of FIG. 7.

What is shown here is the operation timing of word line WLi (i=1, 2, 3, 4) connected to a single memory cell MCi and the control signal line $\phi i$ (i=1, 2, 3, 4), centering around times t1 and t5 of times t1 to t6 shown in FIG. 5, and time t3 when one of sense amplifiers SA1 to SA4 operates.

Specifically, after a single control signal line $\phi i$ has turned on to precharge bit line BL, capacitor-plate line PL, and sense amplifier SAi, word line WLi turns on, enabling the information read from capacitor Ci of the memory cell MCi (the potential between the bit line and capacitor-plate line) to be transmitted to sense amplifier SAi. Then, after the control signal line φi has turned off, sense amplifier SAi operates to amplify and latch the information read from capacitor Ci. The rewriting (writing) is done as follows: after bit line BL has been precharged with capacitor-plate line PL being precharged, sense amplifier SAi is connected to bit line BL for charging and discharging, and then word line WLi is turned off to complete the rewriting. If it is possible to set the potential of bit line BL to either that of the Vcc power supply or that of the Vss power supply (the ground potential) because sense amplifiers SA1 to SA4 are of the CMOS structure, the precharging of bit line BL during rewriting (or writing) may be eliminated. Use of sense amplifiers SA1 to SA4 like SRAM cells allows them to act as cache memories.

FIG. 9 is a circuit diagram of a portion of a column in a DRAM according to a fourth embodiment of the present invention.

In the DRAM, SRAM cells are used for each element REGi (i=1, 2, 3, 4) of the register in the DRAM of FIG. 1 or FIG. 7. A transfer gate TG, whose gate is controlled by control signal line RLi (i=1, 2, 3, 4), is connected between each element REGi and bit line (or signal input node of sense amplifier). The transfer gate CS, whose gate is controlled by the column select signal CD, is connected between each element REGi and input/output lines (I/O)i and/(I/O)i. With the DRAM of such an arrangement, four bits of information is read from one column simultaneously.

FIG. 10 shows a single element when the SRAM cells, serving as the elements REGi of the register in the FIG. 9 DRAM, are replaced with sense amplifiers SAi.

FIG. 11 is a circuit diagram of a portion of a DRAM according to a fifth embodiment of the present invention.

The DRAM employs shared sense-amplifier techniques, in which a plurality of columns (two columns, in this example) share a single sense amplifier SA in, for example, the FIG. 1 DRAM. Reference characters T31 and T41 indicate transfer gates that are inserted so as to correspond to bit line BL1 and capacitor-plate line PL1 in the same column, and that are controlled by control signals BL1 and φPL1, respectively. Similarly, reference characters T32 and T42 indicate transfer gates that are inserted so as to correspond to bit line BL2 and capacitor-plate line PL2 in the same column, and that are controlled by control signals φBL2 and φPL2, respectively. The control signals φBL1, φPL1, φBL2, and φPL2 operate so as to electrically selectively connect one of two columns to a single sense amplifier SA.

FIG. 12 is a circuit diagram of a portion of a DRAM according to a sixth embodiment of the present invention.

The DRAM uses a cell array of an open bit-line structure in, for example, the FIG. 1 DRAM, to which shared sense-amplifier techniques have been applied. Reference characters T31 and T41 indicate transfer gates that are inserted so as to correspond to bit line BL1 and capacitor-plate line PL1 in the same column on the left side of sense amplifier SA, and that are controlled by control signals φBL1 and φPL1, respectively. Similarly, reference characters T32 and T42 indicate transfer gates that are inserted so as to correspond to bit line BL2 and capacitor-plate line PL2 in the same column on the right side of sense amplifier SA, and that are controlled by control signals φBL2 and φPL2, respectively. The control signals BL1, φPL1, φBL2, and φPL2 operate so as to electrically selectively connect one of two columns on both sides to a single sense amplifier SA.

It is possible to combine the embodiment of FIG. 11 and that of FIG. 12.

FIG. 13 is a circuit diagram of a portion of a DRAM according to a seventh embodiment of the present invention.

In the DRAM, the sense amplifiers SA on both sides of the memory cell block in FIG. 12 are staggered.

Like the techniques proposed in Published Unexamined Japanese Patent Application No. 3-41315, the present invention may be applied to a cache memory-incorporated semiconductor memory device which uses as a storing means a register containing as many storing elements as the number of capacitors per memory cell, or as many sense amplifiers as the number of capacitors per memory cell, and which contains a control means that enables access to the storing means independent of the array of memory cells to use the storing means as a cache memory. An example of this is shown in FIG. 14.

Figure 14:
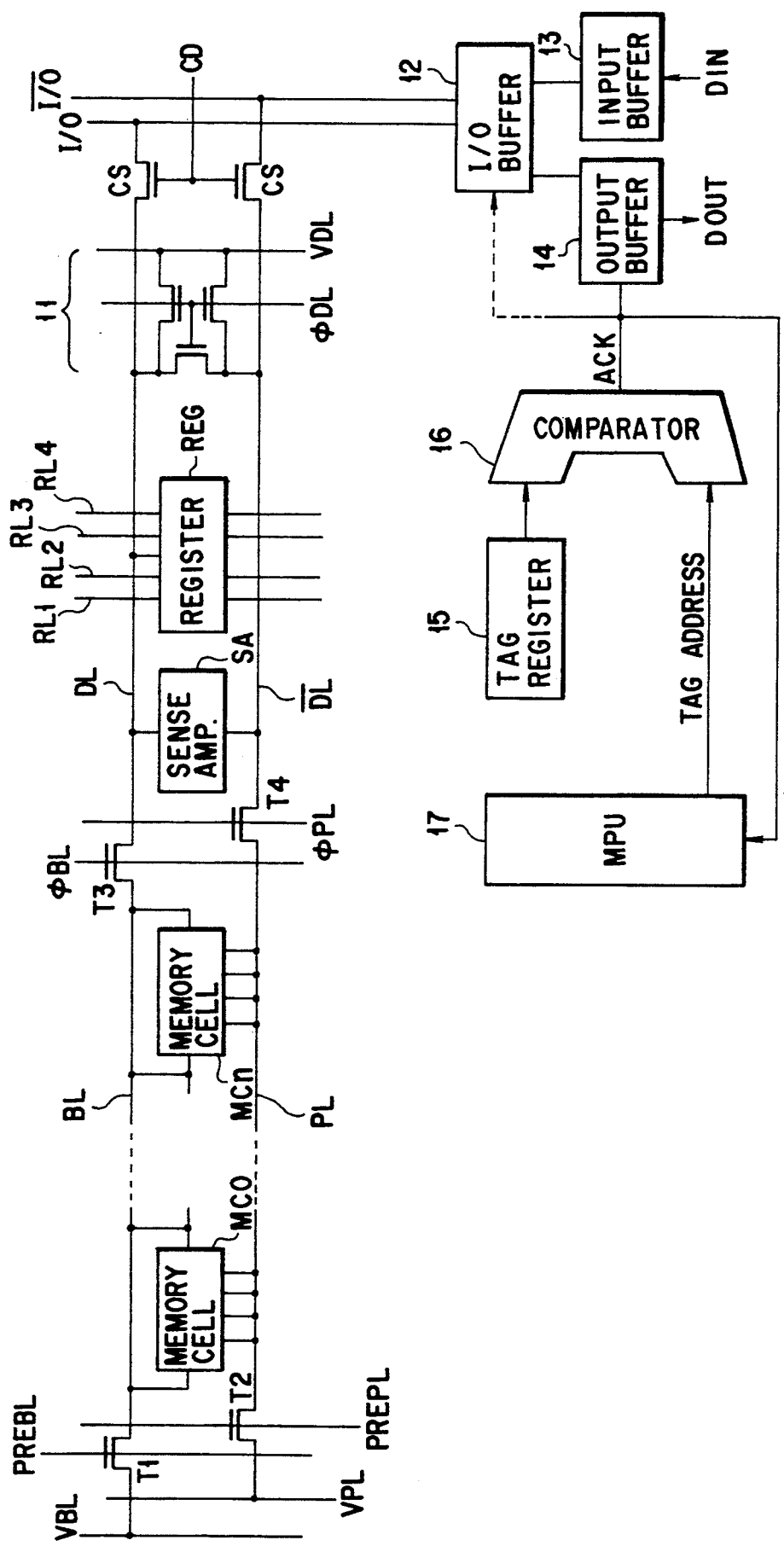
FIG. 14 is a circuit diagram of a portion of a DRAM memory cell array according to an eighth embodiment of the present invention.

FIG. 14 is a circuit diagram of a portion of a cache memory-incorporated DRAM according to an eighth embodiment of the present invention.

This DRAM is such that a control means for enabling access to the register independent of the memory cell MC is added to the DRAM shown in FIG. 1 or FIG. 3 to use the register REG as a cache memory. An example of such a control means is transfer gates T3 and T4, which may be brought in the off state in accessing the register REG independently of the memory cell MC.

A TAG memory and data memory are used as cache memories. In this example, the entire register REG is allowed to function as the data memory (data register). The TAG memory (TAG register 15) is provided separately from the data register REG. A cache memory address decoder (not shown) is provided to decode the set address in the cache memory address (set address plus TAG address). A comparator 16 is provided as a judging means that judges whether or not the address for access to the cache memory has been allocated to the TAG register 15 of the cache memory, that is, whether or not the information stored in the data register REG is wanted. An MPU 17 is also provided as a control means for the cache memory. The MPU 17 has the function generally required for control of cache memory. Especially, in this example, it functions in such a manner that it accesses the elements of the register REG to read the data from the corresponding column and outputs it when the information stored in the register REG is read out, and that, when the information not stored in the register REG is needed, it writes back the current contents of the register REG into the corresponding memory cell MC, accesses the memory cell storing the necessary information to read it serially, and then stores it in the register REG and at the same time, outputs it.

In FIG. 14, reference characters DL and /DL indicate a pair of complementary digit lines connected to sense amplifier SA, and numeral 11 denotes a digit-line precharger circuit.

The digit-line precharger circuit 11 is turned on by a digit-line precharging signal φDL to precharge the digit line pair DL and /DL to the digit-line precharging potential VDL. Numeral 12 indicates an input/output buffer circuit to which the transfer gate pairs CS and CS of a plurality of columns are connected via the input-/output line pair I/O and/(I/O). An input buffer circuit 13 and an output buffer circuit 14 are connected to the input/output buffer circuit 12.

Figure 15:
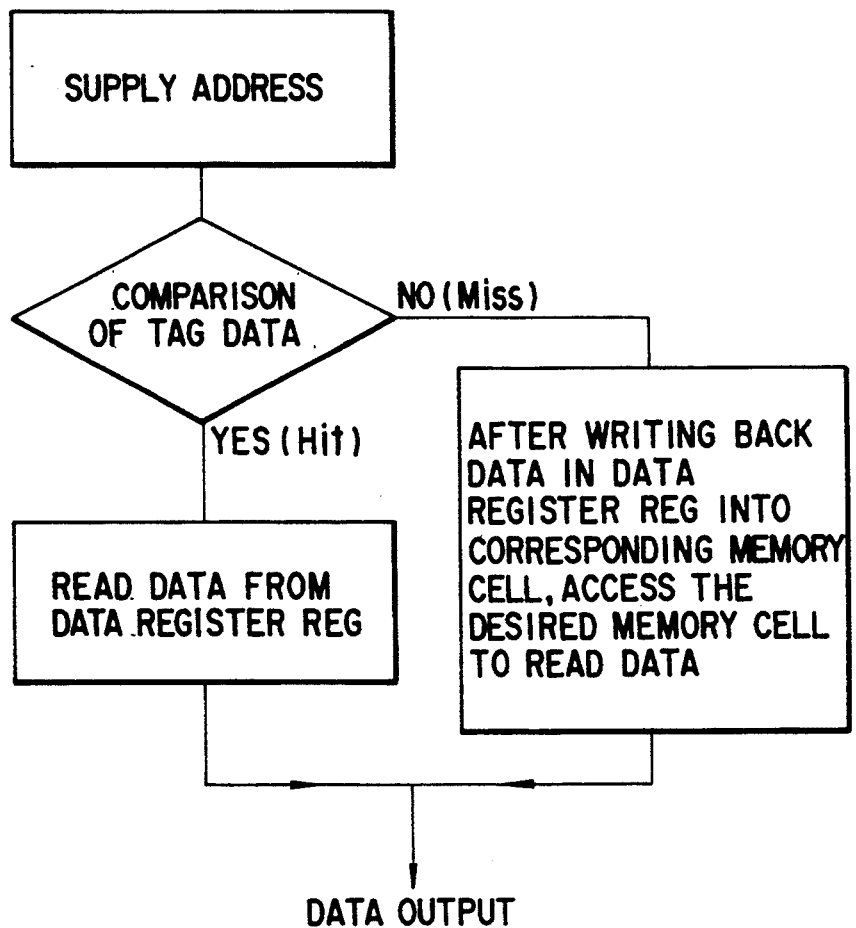
FIG. 15 is a general flowchart for an example of cache memory control in the MPU of FIG. 14.

FIG. 15 is a flowchart outlining an example of cache memory control by the MPU17 of FIG. 14.

The cache-memory set address supplied from MPU 17 is first placed in the cache-memory address decoder (not shown). Based on the output of the word-line driver circuit of the address decoder, the TAG register 15 undergoes read control to selectively activate the individual memory cells (register elements). The output from each element of the TAG register 15 and the TAG address from the MPU 17 are supplied to the comparator 16. When those two inputs coincide with each other, the comparator 16 produces an agreement signal as an output signal ACK (acknowledge). The output from the elements of the data register REG goes via the input/output buffer circuit 12 to the output buffer circuit 14, which is activated by the agreement signal and the output of which then enters the MPU 17. If those two inputs do not agree with one another, the comparator 16 generates a disagreement signal as the output signal ACK. Then, the MPU 17 judges that the output from the data register REG at that time is incorrect, and then accesses the desired memory cell MC. As shown by the dotted line in FIG. 14, the agreement/disagreement signal from the comparator 16 may be supplied to the input/output buffer circuit 12 to activate or deactivate the latter, depending on this signal.

Like the techniques proposed in Published Unexamined Japanese Patent Application No. 4-48312, the present invention may be applied to a serial-access semiconductor memory device that uses a serial-access control means for serially accessing a plurality of memory cells in a given column in the memory cell array, reading bits of information from the desired memory cell time-sequentially, and then sequentially rewriting these bits of information into a different unused memory cell in the same column. An example of this is shown in FIGS. 16 to 20.

Figure 16:
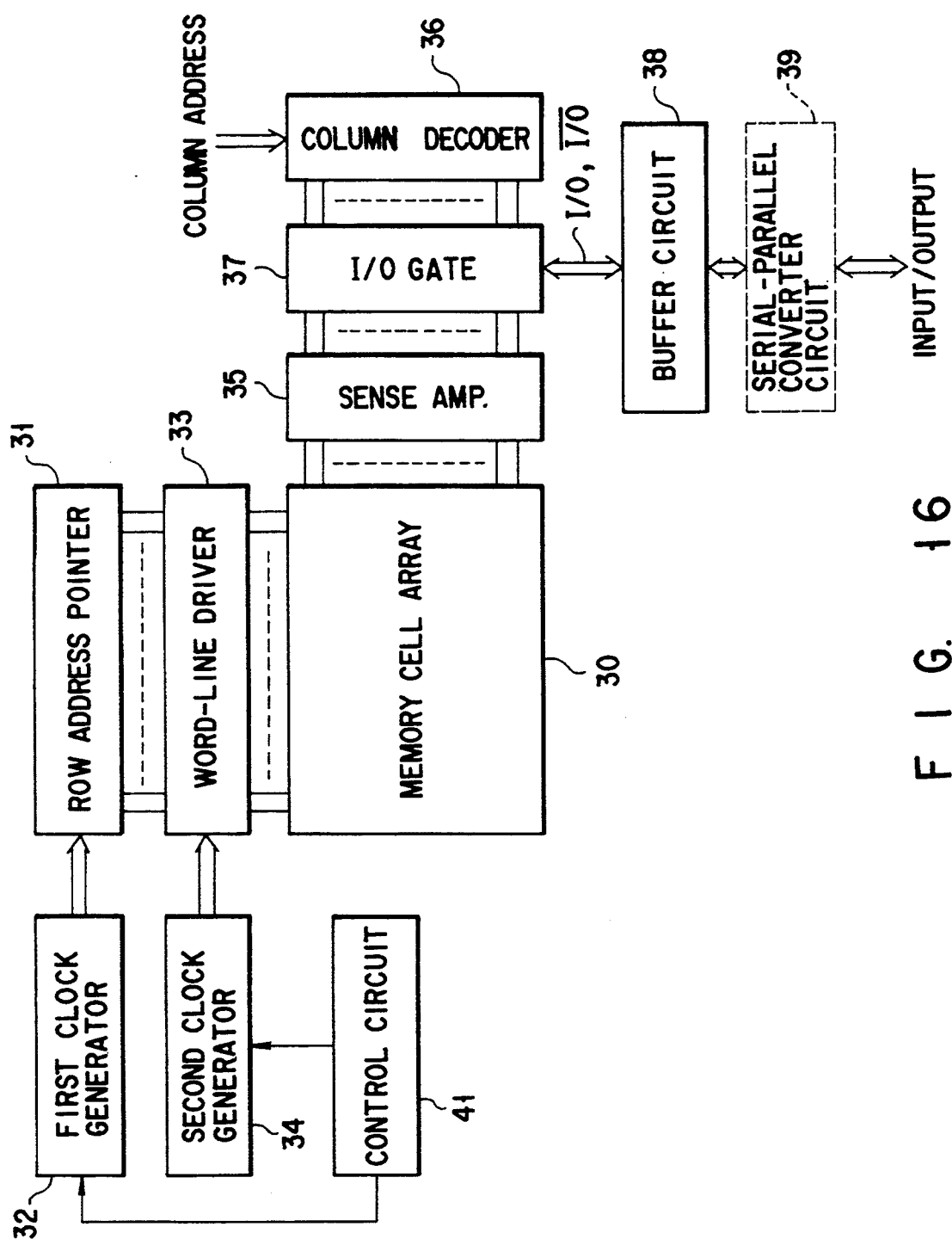
FIG. 16 is a circuit diagram of a DRAM according to a ninth embodiment of the present invention.

FIG. 16 is a circuit diagram of a portion of a serial-access DRAM according to a ninth embodiment of the present invention.

In FIG. 16, numeral 30 indicates a memory cell array where cascade-gate memory cells are arranged in matrix form, 31 a row address circuit that outputs a row address signal for serially specifying the row address in the memory cell array, 32 a first clock generator circuit that supplies a first clock signal to the row address circuit 31, 33 a word-line driver circuit that selectively drives the word line connected to the memory cell with the address specified by the address circuit 31, and 34 a second clock generator circuit that supplies a second clock signal to the word-line driver circuit 33.

Numeral 35 represents a sense amplifier that senses the potential between the bit line and capacitor-plate line of the memory cell array 30. Numeral 36 denotes a column decoder that decodes the column address, 37 the input/output gates (column select circuit) that are selectively driven by the output of the column decoder 36, and 38 a buffer circuit connected to the input/output gates 37 via the input/output pair I/O and /(I/O).

A control circuit 41 controls the operation timing of the first clock generator circuit 32, second clock generator circuit 34, sense amplifier 35, etc.

These control circuit 41, first clock generator circuit 32, second clock generator circuit 34, sense amplifier 35, row address circuit 31, and word-line driver circuit 33 have such an access control function as serially accesses a plurality of memory cells in a given column in the memory cell array 30, reads bits of information from the desired memory cell time-sequentially, and sequentially rewrites these bits of information into a different unused memory cell in the same column.

Figure 17:
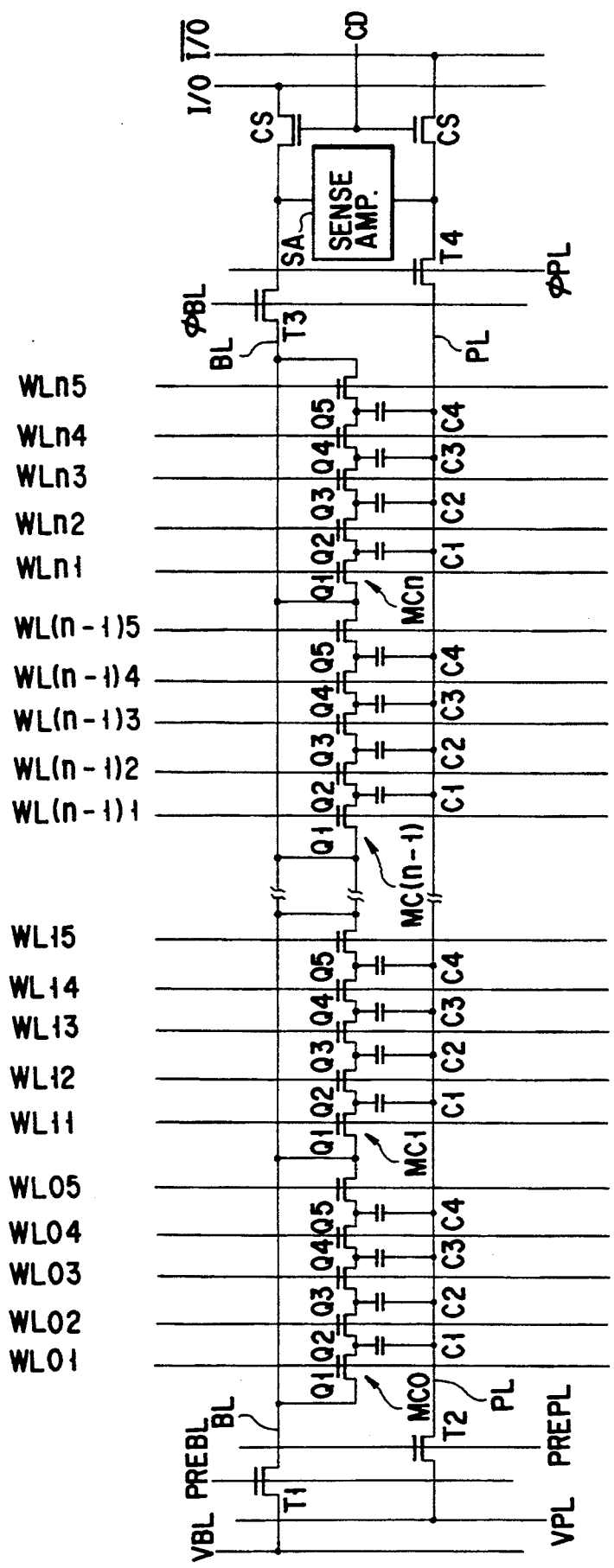
FIG. 17 is a circuit diagram of one column of the memory cell array with the associated sense amplifier and input/output gates of FIG. 16.

FIG. 17 is a circuit diagram of an example of a column of the memory cell array 30 with the associated sense amplifier 35 and input/output gates 37.

MC0 to MCn are n (an integer)+1 memory cells in the same column. Of the n+1 memory cells, n memory cells are used to memorize 4n bits of block data, and the rest is an extra cell. The gates of transistors Q1 to Q5 of each of memory cells MC0 to MCn are connected to word lines WL01 to WL05, ..., WLn1 to WLn5, respectively.

Figure 18:
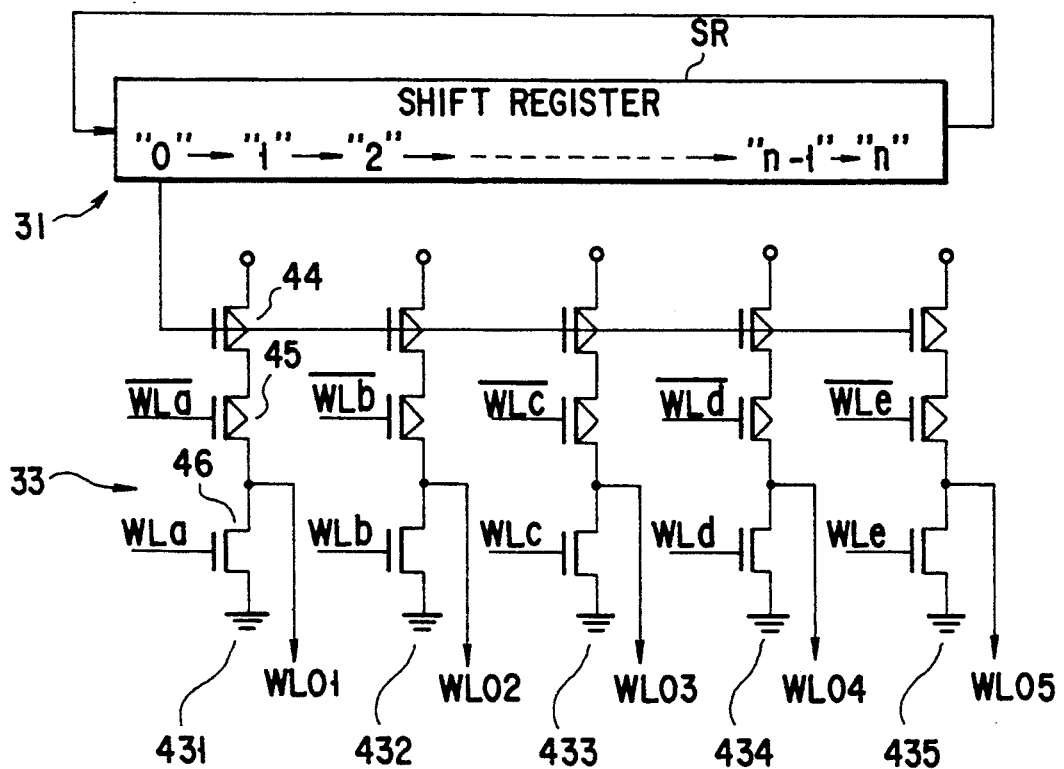
FIG. 18 is a circuit diagram of a portion of an example of the address circuit and word-line drive circuit of FIG. 16.

FIG. 18 is a circuit diagram of a portion of an example of the row address circuit 31 and word-line driver 33 of FIG. 16.

Figure 19:
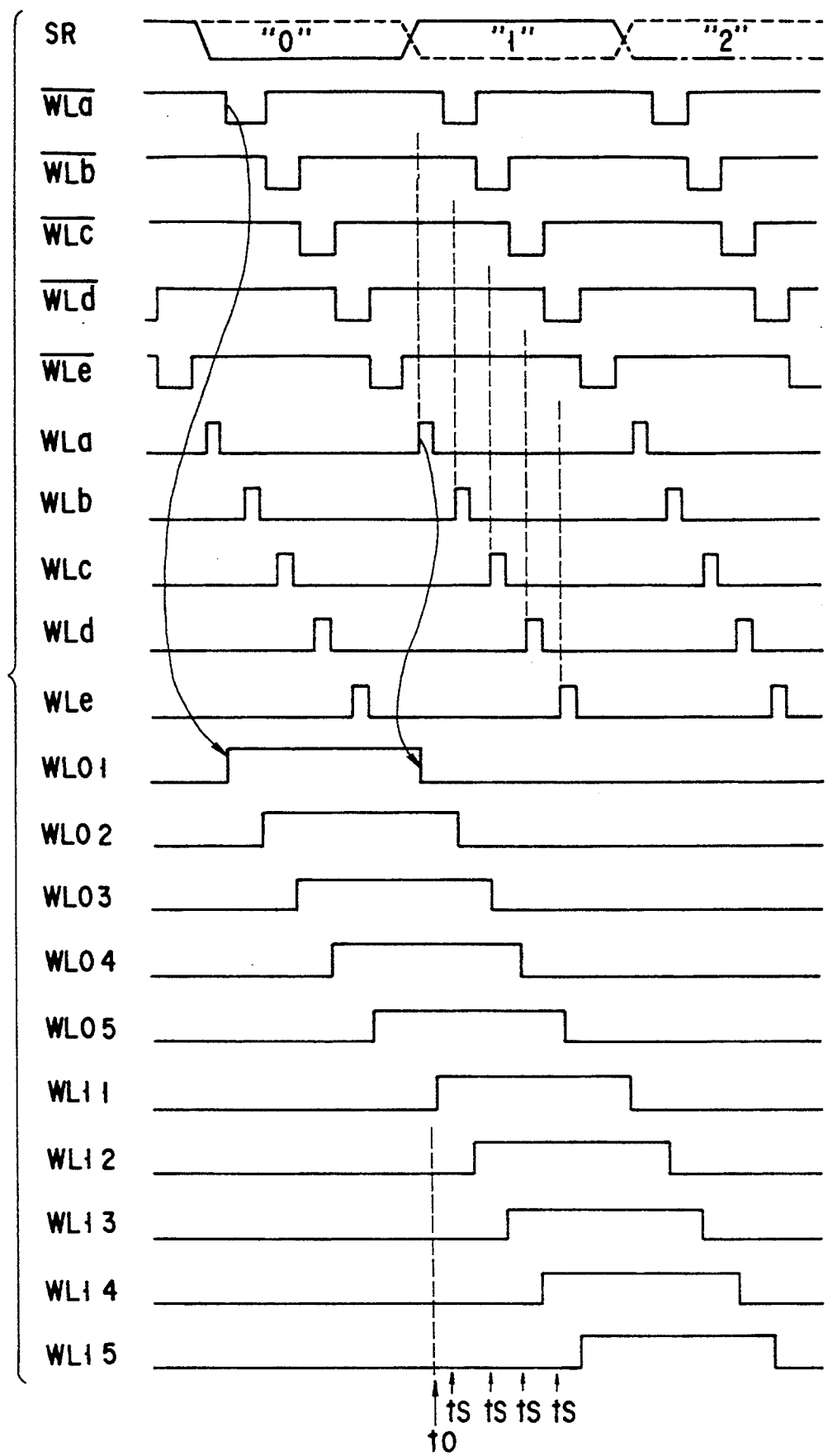
FIG. 19 is a timing waveform diagram for an example of the operation of the address circuit and word-line driver circuit of FIG. 18.

FIG. 19 is a waveform diagram showing the timing of various signals in the operation of the row address circuit 31 and word-line driver circuit 33.

In FIG. 18, the row address circuit 31 is made up of a shift register SR. The shift register SR has n+1 stages corresponding to n+1 groups of word lines WL01 to WL05, ..., WLn1 to WLn5, each group consisting of five lines, in the memory cell array 30. In other words, it has as many stages as 1/k of the number of rows in the memory cell array 30, (n+1)×k (an integer, 5 in this example). The n+1 stages of shift circuits are connected serially to one another so as to form a ring circuit with the final-stage output returning to the first stage as an input. At the beginning of an initial access after the DRAM's power has turned on, the shift register SR is controlled so that the shift register stage (for example, the final stage) for specifying the starting address may start supplying an address signal.

The word-line driver circuit 33 uses as many word-line driver circuits as the number of rows in the memory cell array 30, that is, n+1 groups of word-line driver circuits, each consisting of five drivers. The output of each stage of the shift register SR is supplied as an operation control signal to the five word-line drivers 431 to 435 of the corresponding group. In other words, the output of each stage of the shift register SR selectively controls five word-line driver circuits 431 to 435 of the corresponding group.

In each of the word-line driver circuits 431 to 435, an operation control PMOS transistor 44, a word-line driving PMOS transistor 45, and a word-line pull-down NMOS transistor 46 are cascade-connected between the word-line driving power-supply potential node and the ground potential (vss) node. The gates of the transistor 44, are all supplied with the output of the corresponding shift register stage. The gates of the transistors 45, are supplied with the pull-up control signals/WLa to/WLe from the second clock generator circuit 34, respectively, while the gates of the NMOS transistors 46, are supplied with the pull-down control signals WLa to WLe from the second clock generator circuit 34, respectively. This allows the word-line driver circuit 431 to 435 to supply word-line driving signals at the respective output nodes (the junction point of transistors 45 and 46), which makes it possible to turn on the five word lines WL11 to WL15 of each group in sequence for a certain period of time in a single serial access.

Figure 20:
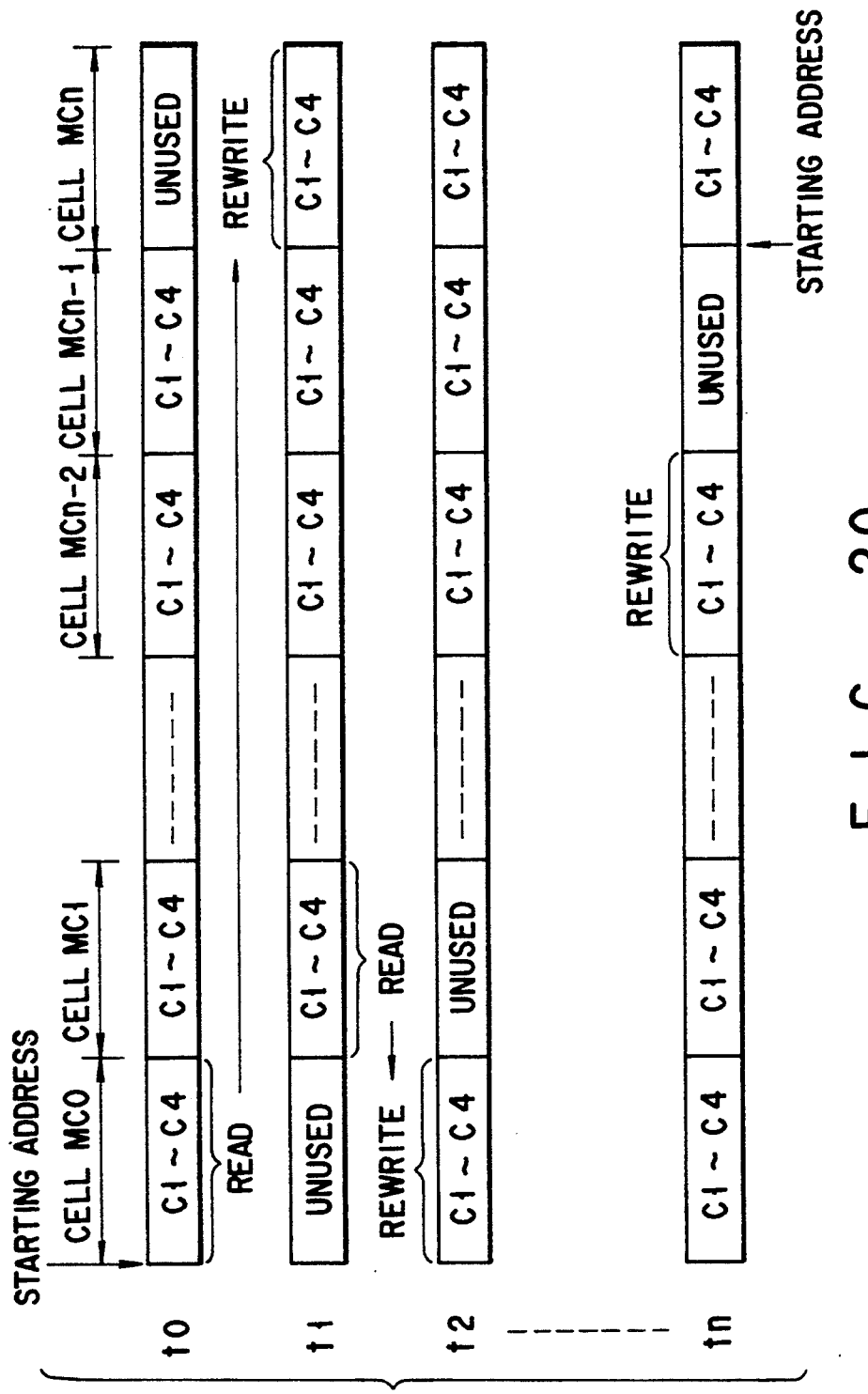
FIG. 20 is a timing diagram showing serial access to a memory cell in a given column in the FIG. 16 DRAM.

FIG. 20 shows the timing for explaining a serial access to a plurality of memory cells in a given column in the FIG. 16 DRAM.

Assuming that in FIG. 17, a series of data (block data) is stored in the cells MC0 to MC(n−1) at an initial state with cell MCn being unused (memorizing nothing), a general explanation will be given as to serial accessing by which the block data is read out in sequence and at the same time, is rewritten, referring to FIG. 20.

In a first serial access, at time t0, word lines WL01 to WL05 are turned on in sequence to read four bits of information from the capacitors C1 to C4 of cell MC0 onto bit line BL, and then word lines WL11 to WL15 are sequentially turned off to rewrite the four bits of information in the capacitors C1 to C4 of a single unused cell (MCn in this case) in the same column that contains MC0.

At time t1, four bits of information are read from cell MC1 onto bit line BL, and then they are rewritten in a single unused cell (MC0 in this case) in the same column, in the same manner as described above.

Similarly, the read/write operations are done in units of two cells in the same column, their read-write combination differing from each other in the same column, until at time tn, the four bits of information in cell MC(n−1) have been rewritten in cell MC(n−2).

After such a single serial access, the block data has been stored in cells MCn, MC0 to MC(n−2).

By the first serial access to n+1 cells in the same column, a series of block data stored in n cells has been read in sequence, and at the same time, has been rewritten in n cells including a single cell that had been unused before the reading.

In a second serial access, after the starting address (word-line address) for the preceding serial access has been decreased by that for one cell, operation starts with the rewriting of the data from cell MCn into cell MC(n−1) and ends with the rewriting of the data from cell MC(n−2) into cell MC(n−3). After such a serial access, the block data has been written in cells MC(n−1), MCn, MC0 to MC(n−3).

The starting address for the preceding serial access may be readily decreased by that for one cell by providing a dummy cycle, making use of the shift register SR consisting of n+1 stages of shift circuits. Specifically, the state of the shift register SR is held at the time when the previous serial access is complete, and the shift register SR is shifted by one stage during the dummy cycle after the previous serial access or before the current serial access.

In the DRAM of FIG. 17, turning on the transistors Q1 to Q5 of the desired cell in that order causes the stored information in capacitors C1 to C4 to be read onto bit line BL in sequence. At the time when the sense amplifier SA starts to operate accordingly, the column select signal CD for the column to be selected is activated to turn on the transfer gate CS, allowing the reading of data to the outside of the DRAM chip. That is, four pieces of digital information (four bits) can be read in a predetermined order. Since such a read operation is sequentially carried out on n memory cells (for example, n=128) used for information storage in the column, it is possible to read 4 bits×128=512 bits in sequence from a single column.

The DRAM of FIG. 16 has an extra memory cell for each column in addition to the data storing memory cells. In serial access to a plurality of memory cells in a given column, the data read from a cell is stored (rewritten) in another cell that had been accessed and is now empty, enabling serial access in columns. This eliminates a means (for example, register REG) for temporarily storing the information read time-sequentially from the memory cell before rewriting, which allows high packing density, squeezing the entire circuitry into a very small size chip.

Therefore, by replacing the memory device that serially reads and writes data in blocks (magnetic disks used as the external memory device of computer systems) with the semiconductor memory device of the present invention, the external memory device can be speeded up.

In recent applications of DRAMs, such fields are expanding rapidly as block transfer with a cache memory or the processing or storage of image data, all of which can be dealt with by serial accessing. The semiconductor memory device of the present invention, therefore, has a wide variety of applications.

As shown by a dotted line in FIG. 16, by placing the serial-parallel converter circuit 39 between the I/O gate 37 and the input/output terminal to perform serial-parallel conversion of the read-out four bits of data, a random-access DRAM of ×4-bit structure can be achieved.

Each of the above-described embodiments of the present invention may be put into practice separately or in various combinations of them within the scope of the present invention.

The previous embodiments described in detail herein using the accompanying drawings are illustrative and not restrictive. The present invention may be practiced or embodied in still other ways without departing the spirit or essential character thereof.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor memory device comprising:
   a memory cell array in which cascade memory cells arranged in matrix form, each cell being composed of a plurality of MOS transistors cascade-connected to each other, and a plurality of information storing capacitors one end of each of which is connected to one end of each of the transistors, respectively;
   word lines equally connected to the memory cells in each row of the memory cell array;
   a bit line equally connected to each column of the memory cell array;
   a capacitor-plate line provided for each column of the memory cell array, and equally connected to the other end of each of the capacitor groups in said memory cells in the corresponding column;
   a bit-line precharger circuit connected to each of said bit lines;
   a capacitor-plate line precharger circuit connected to each of said capacitor-plate lines; and
   a sense amplifier circuit which is provided for column of said memory cell array, and which senses the potential between said bit line and said capacitor-plate line in the read operation.

2. A semiconductor memory device according to claim 1, wherein said memory cell contains three or more cascade-connected MOS transistors whose both ends are connected to the same bit line, and a plurality of information storing capacitors one end of each of which is connected to the respective junction nodes between said MOS transistors, each information storing capacitor being placed near the respective intersections of said bit lines and said word lines, and the gates of said plurality of MOS transistors being connected to the respective word lines.

3. A semiconductor memory device according to claim 1, wherein said memory cell contains a plurality of MOS transistors cascade-connected, whose one end is connected to a bit line, and a plurality of information storing capacitors one end of each of which is connected to one end, farther from said bit line of each of said MOS transistors, each information storing capacitor being placed near the respective intersections of said bit lines and said word lines, and the gates of said plurality of MOS transistors being connected to the respective word lines.

4. A semiconductor memory device according to claim 1, further comprising:
a storing circuit which is provided for column of the said memory cell array, and which temporarily stores bits of information read time-sequentially from the selected memory cell.

5. A semiconductor memory device according to claim 1, wherein said sense amplifiers are provided at a rate of one for every plurality of columns in said memory cell array, and are electrically selectively connected to the plurality of columns.

6. A semiconductor memory device according to claim 1, wherein said memory cell array is of an open bit-line structure, and said sense amplifier circuit is electrically selectively connected to one of the columns on both sides.

7. A semiconductor memory device according to claim 2, further comprising serial-access control means that serially accesses a plurality of memory cells in a given column of said memory cell array, reads bits of information time-sequentially from one of the memory cells storing information, and sequentially rewrites the bits of information into another unused memory cell in the same column that contains the memory cell.

8. A semiconductor memory device according to claim 4, further comprising control means capable of accessing said storing circuit independently of said memory cell array, wherein said storing circuit has as many storing elements as the number of capacitors per memory cell.

9. A semiconductor memory device according to any one of claims 1 through 8, wherein said capacitor-plate line is formed so as to be the wiring on a layer below or above the bit line for the corresponding column.

10. A semiconductor memory device according to any one of claims 1 through 8, wherein the precharging potential VBL at which said bit-line precharger circuit precharges the bit line is equal to the precharging potential VPL at which said capacitor-plate line precharger circuit precharges the capacitor-plate line.

11. A semiconductor memory device according to any one of claims 1 through 8, wherein said bit-line precharger circuit and said capacitor-plate line precharger circuit undergo on/off control independently of each other.

12. A semiconductor memory device according to any one of claims 1 through 8, wherein said bit-line precharger circuit and said capacitor-plate line precharger circuit undergo on/off control with the same timing during the reading of data from the memory cells.

13. A semiconductor memory device according to any one of claims 1 through 8, wherein said capacitor-plate line precharger circuit is brought in the on state during the writing of data into the memory cells to fix the potential of said capacitor-plate line to a certain value.

14. A semiconductor memory device according to any one of claims 1 through 8, wherein said sense amplifier circuit is a latch amplifier whose pair of input/output nodes are connected to said bit line and said capacitor-plate line, respectively.

15. A semiconductor memory device according to any one of claims 1 through 8, wherein said sense amplifier circuit is a differential amplifier whose pair of input nodes are connected to said bit line and said capacitor-plate line, respectively.

16. A semiconductor memory device according to claim 15, further comprising a data write circuit for setting a rewrite potential on said bit line based on the sense output from said sense amplifier.

17. A semiconductor memory device according to any one of claims 1 through 7, further comprising a first transfer gate which is inserted between one input node of said sense amplifier circuit and said bit line, and which under goes on/off control with a specified timing.

18. A semiconductor memory device according to any one of claims 1 through 7, further comprising a transfer gate which is inserted between the other input node of said sense amplifier circuit and said capacitor-plate line, and which undergoes on/off control with a specified timing.

19. A semiconductor memory device according to claim 17, further comprising a second transfer gate which is inserted between the other input node of said sense amplifier circuit and said capacitor-plate line, and which undergoes on/off control with a specified timing.

20. A semiconductor memory device according to claim 19, wherein said first transfer gate and said second transfer gate undergo on/off control independently of each other.

21. A semiconductor memory device according to claim 19, wherein said first transfer gate and said second transfer gate undergo on/off control with the same timing during the reading of data from the memory cells.

22. A semiconductor memory device according to claim 21, wherein said first transfer gate and said second transfer gate are brought in the off state during the time when said sense amplifier circuit senses the potential between said bit line and said capacitor-plate line during the reading of data from the memory cells.

23. A semiconductor memory device according to claim 19, wherein said first transfer gate and said second transfer gate are each brought in the on state with a different timing during the writing of data into the memory cells.

24. A semiconductor memory device according to claim 16, further comprising:
a first transfer gate which is inserted between one input node of said sense amplifier circuit and said bit line, and which undergoes on/off control with a specified timing; and
a second transfer gate which is inserted between the other input node of said sense amplifier circuit and said capacitor-plate line, and which undergoes on/off control with a specified timing, wherein said first and second transfer gates undergo on/off control by a common control signal.

25. A semiconductor memory device according to claim 24, wherein said first transfer gate and said second transfer gate are brought in the off state during the writing (rewriting) of data into the memory cells.

26. A semiconductor memory device according to claim 24, wherein said first transfer gate and said second transfer gate are brought in the off state during the time when said sense amplifier circuit senses the potential between said bit line and said capacitor-plate line during the reading of data from the memory cells.

27. A semiconductor memory device according to claim 25, wherein said first transfer gate and said second transfer gate are brought in the off state during the time when said sense amplifier circuit senses the potential between said bit line and said capacitor-plate line during the reading of data from the memory cells.

28. A semiconductor memory device, comprising:
   circuit units arranged in a row and column matrix, each circuit unit comprising:
      at least three transistors connected in series between first and second data nodes such that a first terminal of a first transistor in said series is connected to said first data node, a second terminal of a last transistor in said series is connected to said second data node, and a first terminal of each remaining transistor in said series is connected to a second terminal of the immediately preceding transistor in said series; and
      a plurality of data storage capacitors, each data storage capacitor having a first terminal connected to the second terminal of one of said transistors except said last transistor in said series;
   capacitor plate lines each connected to the second terminals of the data storage capacitors of the circuit units in a corresponding column of said matrix; and
   sense amplifiers for sensing and amplifying potential differences between respective bit line-capacitor plate line pairs.

29. The semiconductor memory device according to claim 28, further comprising:
   a bit line precharging circuit for precharging said bit lines.

30. The semiconductor memory device according to claim 28, further comprising:
   a capacitor plate line precharging circuit for precharging said capacitor plate lines.

31. The semiconductor memory device according to claim 28, wherein said sense amplifiers comprise latch amplifiers.

32. The semiconductor memory device according to claim 28, wherein said sense amplifiers comprise differential amplifiers.

33. The semiconductor memory device according to claim 28, further comprising:
   switches for selectively connecting at least one bit line-capacitor plate line pair to each sense amplifier.

34. The semiconductor memory device according to claim 28, further comprising:
   read/write circuitry for reading data items out from said data storage capacitors to said first data nodes of said circuit units and for writing data items from said second data nodes to the data storage capacitors of said circuit units;
   registers each including register elements and each connected to the circuit units in a corresponding column of said matrix; and
   register control circuitry for supplying data items from the first data nodes of the circuit units in the columns of said matrix to the register elements of the corresponding registers and for supplying data items from the register elements of the registers to the second data nodes of the circuit units in the corresponding columns of said matrix.

35. The semiconductor memory device according to claim 28, further comprising:
   word lines connected to control terminals of said transistors of said circuit units; and
   access control circuitry connected to said word lines for reading a data item from a first data storage capacitor of a first circuit unit in a first column of said matrix and having valid data items at an access time and writing said data item to a first data storage capacitor of a second circuit unit in said first column of said matrix and not having valid data items at said access time.

36. The semiconductor memory device according to claim 28, wherein said sense amplifiers include shared sense amplifiers each of which is connected to at least two bit line-capacitor plate line pairs.

37. A semiconductor memory device, comprising:
   circuit units arranged in a row and column matrix, each circuit unit comprising:
      at least two transistors connected in series such that a first terminal of a first transistor in said series is connected to a first data node and a first terminal of each remaining transistor in said series is connected to a second terminal of the immediately preceding transistor in said series; and
      data storage capacitors each having a first terminal connected to the second terminal of one of s aid transistors;
   bit lines each connected to the first data nodes of the circuit units in a corresponding column of said matrix;
   capacitor plate lines each connected to the second terminals of the data storage capacitors of the circuit units in a corresponding column of said matrix; and
   sense amplifiers for sensing and amplifying potential differences between respective bit line-capacitor plate line pairs.

38. The semiconductor memory device according to claim 37, further comprising:
   a bit-line precharging circuit for precharging said bit lines.

39. The semiconductor memory device according to claim 37, further comprising:
   a capacitor plate line precharging circuit for precharging said capacitor plate lines.

40. The semiconductor memory device according to claim 37, wherein said sense amplifiers comprise latch amplifiers.

41. The semiconductors memory device according to claim 37, wherein said sense amplifiers comprise differential amplifiers.

42. The semiconductor memory device according to claim 37, further comprising:

switches for selectively connecting at least one bit line-capacitor plate line pair to each sense amplifier.

43. The semiconductor memory device according to claim 37, further comprising:
   read/write circuitry for reading data items out from the data storage capacitors to said first data nodes of said circuit units and for writing data items from said first data nodes to the data storage capacitors of said circuit units;
   registers each including register elements and each connected to the circuit units in a corresponding column of said matrix;
   register control circuitry for supplying data items from the first data nodes of the circuit units in the columns of said matrix to the register elements of the corresponding registers and for supplying data items from the register elements of the registers to the first data nodes of the circuit units in the corresponding columns of said matrix.

44. The semiconductor memory device according to claim 37, further comprising:
   word lines connected to control terminals of said transistors of said circuit units; and
   access control circuitry connected to said word lines for reading a data item from a first data storage capacitor of a first circuit unit in a first column of said matrix and having valid data items at an access time and writing said data item to a first data storage capacitor of a second circuit unit in said first column of said matrix and not having valid data items at said access time.

45. The semiconductor memory device according to claim 37, wherein said sense amplifiers include shared sense amplifiers each of which is connected to at least two bit line-capacitor plate line pairs.

* * * * *